US012538639B2

United States Patent
Qu

(10) Patent No.: US 12,538,639 B2
(45) Date of Patent: Jan. 27, 2026

(54) LIGHT-EMITTING ELEMENT, DISPLAY DEVICE, AND METHOD FOR MANUFACTURING DISPLAY DEVICE

(71) Applicant: Sharp Display Technology Corporation, Kameyama (JP)

(72) Inventor: Yang Qu, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 398 days.

(21) Appl. No.: 18/272,905

(22) PCT Filed: Jan. 21, 2021

(86) PCT No.: PCT/JP2021/002011
§ 371 (c)(1),
(2) Date: Jul. 18, 2023

(87) PCT Pub. No.: WO2022/157879
PCT Pub. Date: Jul. 28, 2022

(65) Prior Publication Data
US 2024/0138177 A1   Apr. 25, 2024

(51) Int. Cl.
*H10K 50/15* (2023.01)
*H10K 50/115* (2023.01)
(Continued)

(52) U.S. Cl.
CPC .......... *H10K 50/15* (2023.02); *H10K 50/115* (2023.02); *H10K 59/1201* (2023.02); *H10K 85/141* (2023.02); *H10K 85/146* (2023.02); *B82Y 20/00* (2013.01); *B82Y 40/00* (2013.01); *H10K 59/8731* (2023.02)

(58) Field of Classification Search
None
See application file for complete search history.

(56) References Cited

U.S. PATENT DOCUMENTS

2009/0087792 A1   4/2009  Izumi et al.
2010/0108984 A1   5/2010  Cho et al.
(Continued)

FOREIGN PATENT DOCUMENTS

JP   2009-087760 A   4/2009
JP   2010-114079 A   5/2010
(Continued)

OTHER PUBLICATIONS

Pengyu Tang et al. "Realizing 22.3% EQE and 7-Fold Lifetime Enhancement in QLEDs via Blending Polymer TFB and Cross-Linkable Small Molecules for a Solvent-Resistant Hole Transport layer", ACS Appl. Mater. Interfaces, Feb. 24, 2020, vol. 12, pp. 13087-13095, pp. 13091-13092, fig. 1,7.

*Primary Examiner* — Anthony Ho
(74) *Attorney, Agent, or Firm* — ScienBiziP, P.C.

(57) ABSTRACT

A light-emitting element includes a first electrode, a hole transport layer formed on the first electrode, a light-emitting layer formed on the hole transport layer, and a second electrode formed on the light-emitting layer, wherein the hole transport layer contains a first hole transport material having a 3D mesh structure with molecules including a hole-transportability skeleton and at least two thermosetting functional groups being joined together to constitute a high molecule and contains a second hole transport material including a plurality of molecules having hole transportability.

18 Claims, 13 Drawing Sheets

(51) Int. Cl.
*H10K 59/12* (2023.01)
*H10K 85/10* (2023.01)
*B82Y 20/00* (2011.01)
*B82Y 40/00* (2011.01)
*H10K 59/80* (2023.01)

(56) References Cited

U.S. PATENT DOCUMENTS

| | | |
|---|---|---|
| 2012/0049164 A1 | 3/2012 | Inbasekaran et al. |
| 2012/0049168 A1 | 3/2012 | Inbasekaran et al. |
| 2014/0175390 A1 | 6/2014 | Kim et al. |

FOREIGN PATENT DOCUMENTS

| | | |
|---|---|---|
| JP | 2013-060368 A | 4/2013 |
| JP | 2013-168554 A | 8/2013 |
| JP | 2013-536984 A | 9/2013 |
| KR | 20080002023 A | 1/2008 |
| KR | 10-1973287 B1 | 4/2019 |

(a)

(b)

(c)

(a)

VNPB:PVK = 1:2

(b)

VNPB:PVK = 1:1

(c)

ONLY PVK (a)

(b)

(c)

VNPB:PVK = 1:2

(a)

(b)

(a)

(b)

(a)

(b)

(a)

(b)

LIGHT-EMITTING ELEMENT, DISPLAY DEVICE, AND METHOD FOR MANUFACTURING DISPLAY DEVICE

TECHNICAL FIELD

The present disclosure relates to a light-emitting element, a display device, and a method for manufacturing a display device.

BACKGROUND ART

Various display devices that include light-emitting elements have been recently developed; among them, display devices that include organic light-emitting diodes (OLEDs) or quantum-dot light-emitting diodes (QLEDs), which can achieve low power consumption, slimming down, high image quality and other things, have received considerable attention.

For instance, Patent Literature 1 describes a QLED with its organic hole transport layer formed of a high molecular material having hole transportability but having no 3D mesh structure, including poly(phenylenevinylene) (PPV), poly[2-methoxy-5-(2-ethyl-hexyloxy)-1,4-phenylenevinylene] (MEH-PPV), poly(9-vinylcarbazole)(PVK), and poly[(9,9-dioctylfluorenyl-2,7-dyl)-co-(4,4-(N-(4-sec-butylphenyl)) diphenylamine)](TFB).

CITATION LIST

Patent Literature

Patent Literature 1: Japanese Unexamined Patent Application Publication No. 2010-114079

SUMMARY

Technical Problem

However, an organic hole transport layer formed of such a high molecular material as described above, having hole transportability but having no 3D mesh structure can improve a solvent resistance characteristic further than that formed of a low molecular material having hole transportability, but still cannot achieve a satisfactory solvent resistance characteristic, and the organic hole transport layer, formed previously, is unfortunately peeled off by a solvent that is used in a process step after forming of the organic hole transport layer.

On the other hand, an inorganic hole transport layer made of an inorganic material can achieve a satisfactory solvent resistance characteristic but cannot unfortunately achieve a satisfactory hole transport characteristic.

One aspect of the present disclosure has been made in view of these problems and aims to offer the following: a light-emitting element that includes a hole transport layer having a satisfactory solvent resistance characteristic and a satisfactory hole transport characteristic; a display device that includes the light-emitting element; and a method for manufacturing a display device that includes the light-emitting element.

Solution to Problem

To solve the foregoing problems, a light-emitting element in the present disclosure includes the following:

a first electrode;
a hole transport layer formed on the first electrode;
a light-emitting layer formed on the hole transport layer; and
a second electrode formed on the light-emitting layer,
wherein the hole transport layer contains a first hole transport material having a 3D mesh structure with molecules including a hole-transportability skeleton and at least two thermosetting functional groups being joined together to constitute a high molecule and contains a second hole transport material including a plurality of molecules having hole transportability.

To solve the foregoing problems, a display device in the present disclosure includes
a plurality of the light-emitting elements provided on a substrate,
wherein the plurality of light-emitting elements include a first light-emitting element, a second light-emitting element, and a third light-emitting element,
the first light-emitting element includes a first light-emitting layer as the light-emitting layer,
the second light-emitting element includes, as the light-emitting layer, a second light-emitting layer different in emission peak wavelength from the first light-emitting layer, and
the third light-emitting element includes, as the light-emitting layer, a third light-emitting layer different in emission peak wavelength from the first light-emitting layer and the second light-emitting layer.

To solve the foregoing problems, a method for manufacturing a display device in the present disclosure includes the following steps:
forming a first electrode;
forming a hole transport layer including a step of forming a hole-transport-material-mixed solution containing a plurality of molecules each including a hole-transportability skeleton and at least two thermosetting functional groups, and containing a plurality of hole-transportability molecules and a solvent onto the first electrode, followed by a heat treatment to join together the plurality of molecules including the hole-transportability skeleton and the at least two thermosetting functional groups, to constitute a 3D-mesh-structured high molecular material;
forming a light-emitting layer onto the hole transport layer; and
forming a second electrode onto the light-emitting layer.

Advantageous Effect of Disclosure

One aspect of the present disclosure can offer the following: a light-emitting element that includes a hole transport layer having a satisfactory solvent resistance characteristic and a satisfactory hole transport characteristic; a display device that includes the light-emitting element; and a method for manufacturing a display device that includes the light-emitting element.

DESCRIPTION OF EMBODIMENTS

The following describes embodiments of the disclosure on the basis of FIG. 1 through FIG. 17. For convenience in description, components having the same functions as those of components described in a particular embodiment.

First Embodiment

Figure 1:
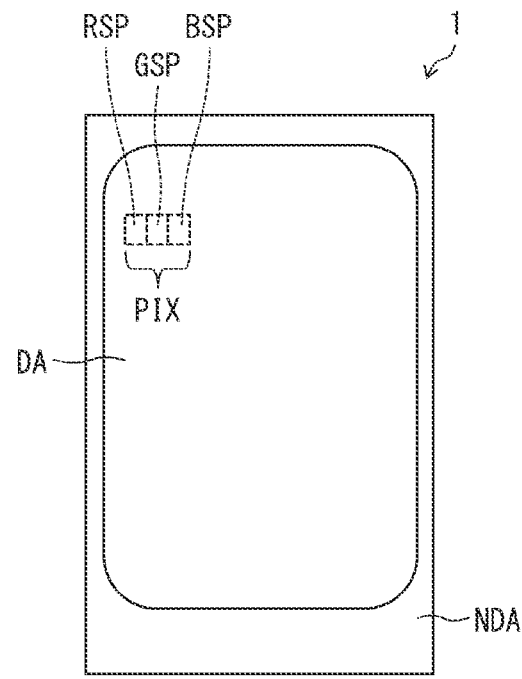
FIG. 1 is a plan view of the schematic configuration of a display device in a first embodiment.

FIG. 1 is a plan view of the schematic configuration of a display device 1 in a first embodiment.

As illustrated in FIG. 1, the display device 1 includes a frame region NDA and a display region DA. The display region DA of the display device 1 is provided with a plurality of pixels PIX, and each pixel PIX includes a red subpixel RSP, a green subpixel GSP, and a blue subpixel BSP. This embodiment describes a non-limiting instance where a single pixel PIX is composed of a red subpixel RSP, a green subpixel GSP, and a blue subpixel BSP. For instance, a single pixel PIX may further include a subpixel of another color in addition to the red subpixel RSP, green subpixel GSP and blue subpixel BSP.

Figure 2:
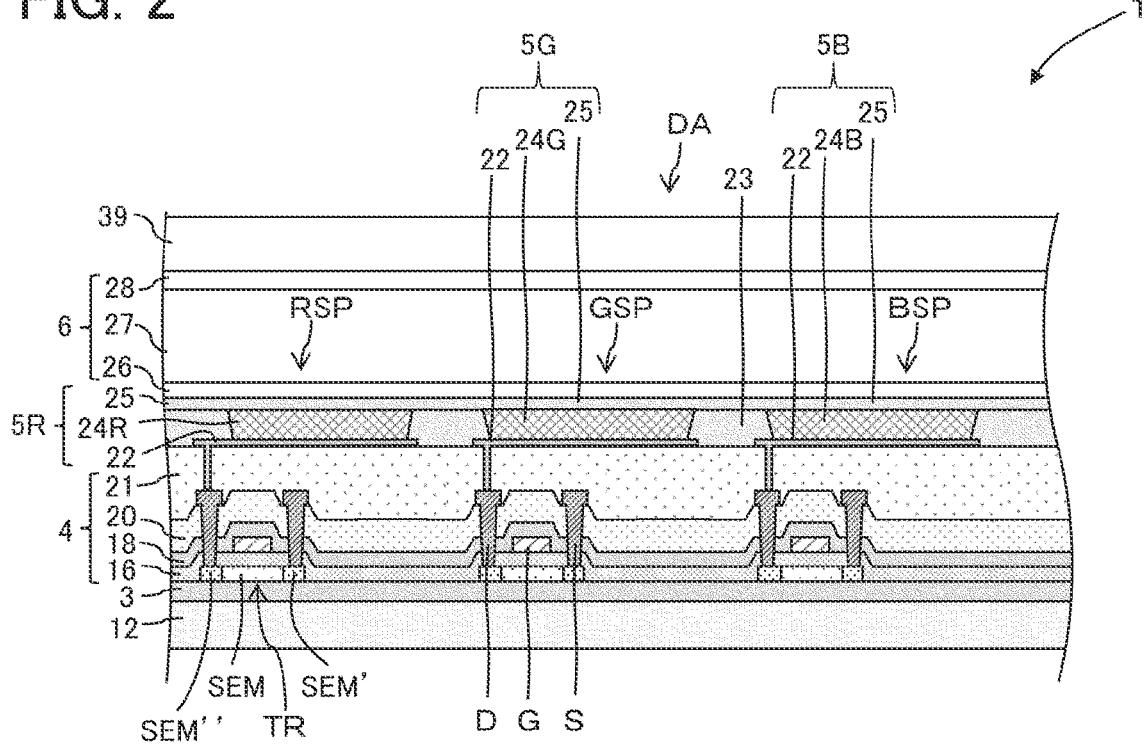
FIG. 2 is a sectional view of the schematic configuration of the display region of the display device in the first embodiment.

FIG. 2 is a sectional view of the schematic configuration of the display region DA of the display device 1 in the first embodiment.

As illustrated in FIG. 2, in the display region DA of the display device 1, a barrier layer 3; a thin-film transistor layer 4 including transistors TR, a red light-emitting element 5R, a green light-emitting element 5G, a blue light-emitting element 5B, a bank 23 (transparent resin layer), a sealing layer 6, and a function film 39 are provided on a substrate 12 in the stated order from near the substrate 12.

The red subpixel RSP, provided in the display region DA of the display device 1, includes the red light-emitting element 5R (first light-emitting element), the green subpixel GSP, provided in the display region DA of the display device 1, includes the green light-emitting element 5G (second light-emitting element), and the blue subpixel BSP, provided in the display region DA of the display device 1, includes the blue light-emitting element 5B (third light-emitting element). The red light-emitting element 5R, included in the red subpixel RSP, includes the following: a first electrode 22 (anode); a function layer 24 including a red light-emitting layer; and a second electrode 25 (cathode), the light-emitting element 5G, included in the green subpixel GSP, includes the following: the first electrode 22 (anode); a function layer 24G including a green light-emitting layer; and the second electrode 25 (cathode), and the blue light-emitting element 5B, included in the blue subpixel BSP, includes the following: the first electrode 22 (anode); a function layer 24B including a blue light-emitting layer; and the second electrode 25 (cathode).

The substrate 12 may be a resin substrate made of a resin material, such as polyimide, or may be a glass substrate. This embodiment, which describes the display device 1 as a flexible display device, describes a non-limiting instance where a resin substrate made of a resin material, such as polyimide, is used as the substrate 12. A glass substrate can be used as the substrate 12 when the display device 1 is described as an inflexible display device.

The barrier layer 3 is a layer that protects the transistors TR, red light-emitting element 5R, green light-emitting element 5G and blue light-emitting element 5B from intrusion of foreign substances, such as water and oxygen, and can be composed of, for instance, a silicon oxide film, a silicon nitride film or a silicon oxide nitride film, all of which are formed through CVD, or a laminate of these films.

The transistor TR portion of the thin-film transistor layer 4 including the transistors TR includes the following: a semiconductor film SEM and doped semiconductor films SEM' and SEM"; an inorganic insulating film 16; a gate electrode G; an inorganic insulating film 18; an inorganic insulating film 20; a source electrode S and a drain electrode D; and a flattening film 21, and portions excluding the transistor TR portion of the thin-film transistor layer 4 including the transistors TR includes the inorganic insulating film 16, the inorganic insulating film 18, the inorganic insulating film 20, and the flattening film 21.

The semiconductor films SEM, SEM' and SEM" may be composed of, for instance, low-temperature polysilicon (LTPS) or an oxide semiconductor (e.g., In—Ga—Zn—O semiconductor). Although this embodiment describes, by way of example, an instance where the transistors TR are of top gate structure, the transistors TR may be of bottom gate structure.

The gate electrode G, the source electrode S and the drain electrode D can be composed of, for instance, a metal monolayer film containing at least one of aluminum, tungsten, molybdenum, tantalum, chromium, titanium and copper, or a laminated film of these materials.

The inorganic insulating film 16, the inorganic insulating film 18 and the inorganic insulating film 20 can be composed of, for instance, a silicon oxide film, a silicon nitride film or a silicon oxide nitride film, all of which are formed through CVD, or a laminate of these films.

The flattening film 21 can be composed of an organic material that can be applied, such as polyimide or acrylic.

The red light-emitting element 5R includes the following: the first electrode 22 (anode) over the flattening film 21; the function layer 24R including the red light-emitting layer; and the second electrode 25 (cathode), the green light-emitting element 5G includes the following: the first electrode 22 (anode) over the flattening film 21; the function layer 24G including the green light-emitting layer; and the second electrode 25 (cathode), and the blue light-emitting element 5B includes the following: the first electrode 22 (anode) over the flattening film 21; the function layer 24B including the blue light-emitting layer; and the second electrode 25 (cathode). It is noted that the bank 23 (transparent resin layer), which is insulating, covering the edge of the first electrode 22 (anode) can be formed by, for instance, applying an organic material, such as polyimide or acrylic, followed by patterning through photolithography.

The function layer 24R including the red light-emitting layer can be composed of, for instance, a stack of, in sequence on the first electrode 22 (anode), a hole injection layer, a hole transport layer, a red light-emitting layer, an electron transport layer, and an electron injection layer. In the function layer 24R including the red light-emitting layer, one or more of the hole injection layer, electron transport layer and electron injection layer excluding the hole transport layer may be omitted as appropriate. This embodiment describes a non-limiting instance where the function layer 24R including the red light-emitting layer is composed of a stack of, in sequence on the first electrode 22 (anode), a hole injection layer, a hole transport layer, a red light-emitting layer and an electron transport layer.

The function layer 24G including the green light-emitting layer can be composed of, for instance, a stack of, in sequence on the first electrode 22 (anode), a hole injection layer, a hole transport layer, a green light-emitting layer, an electron transport layer, and an electron injection layer. In the function layer 24G including the green light-emitting layer, one or more of the hole injection layer, electron transport layer and electron injection layer excluding the hole transport layer may be omitted as appropriate. This embodiment describes a non-limiting instance where the function layer 24G including the green light-emitting layer is composed of a stack of, in sequence on the first electrode 22 (anode), a hole injection layer, a hole transport layer, a green light-emitting layer and an electron transport layer.

The function layer 24B including the blue light-emitting layer can be composed of, for instance, a stack of, in sequence on the first electrode 22 (anode), a hole injection layer, a hole transport layer, a blue light-emitting layer, an electron transport layer, and an electron injection layer. In the function layer 24B including the blue light-emitting layer, one or more of the hole injection layer, electron transport layer and electron injection layer excluding the hole transport layer may be omitted as appropriate. This embodiment describes a non-limiting instance where the function layer 24B including the blue light-emitting layer is composed of a stack of, in sequence on the first electrode 22 (anode), a hole injection layer, a hole transport layer, a blue light-emitting layer and an electron transport layer.

This embodiment also describes a non-limiting instance where the function layer 24R including the red light-emitting layer, the function layer 24G including the green light-emitting layer, and the function layer 24B including the blue light-emitting layer include their respective hole injection layers made of the same material and formed in the same process step, their respective hole transport layers made of the same material and formed in the same process step, and their respective electron transport layers made of the same material and formed in the same process step. For instance, the hole injection layers included in the respective function layers 24R, 24G and 24B may be formed of mutually different materials; for instance, the hole injection layers included in respective two of the function layers 24R, 24G and 24B may be made of the same material and formed in the same process step, and only the hole injection layer included in the remaining function layer may be made of a different material and formed in a different process step. Further, for instance, the hole transport layers included in the respective function layers 24R, 24G and 24B may be formed of mutually different materials; for instance, the hole transport layers included in respective two of the function layers 24R, 24G and 24B may be made of the same material and formed in the same process step, and only the hole transport layer included in the remaining function layer may be made of a different material and formed in a different process step. Furthermore, for instance, the electron transport layers included in the respective function layers 24R, 24G and 24B may be formed of mutually different materials; for instance, the electron transport layers included in respective two of the function layers 24R, 24G and 24B may be made of the same material and formed in the same process step, and only the electron transport layer included in the remaining function layer may be made of a different material and formed in a different process step.

Although this embodiment describes, by way of example, an instance where the red light-emitting element 5R, the green light-emitting element 5G and the blue light-emitting element 5B are quantum-dot light-emitting diodes (QLEDs), the red light-emitting element 5R, the green light-emitting element 5G and the blue light-emitting element 5B may be organic light-emitting diodes (OLEDs); furthermore, some of the red light-emitting element 5R, green light-emitting element 5G and blue light-emitting element 5B may be QLEDs, and the others may be OLEDs. It is noted that the light-emitting layer included in the light-emitting element of each color is a quantum-dot-containing light-emitting layer formed through, for instance, application or ink-jet printing when the red light-emitting element 5R, the green light-emitting element 5G and the blue light-emitting element 5B are QLEDs, and the light-emitting layer included in the light-emitting element of each color is an organic light-emitting layer formed through, for instance, evaporation when the red light-emitting element 5R, the green light-emitting element 5G and the blue light-emitting element 5B are OLEDs.

A control circuit that includes a transistor TR and controls a corresponding one of the red light-emitting element 5R, green light-emitting element 5G and blue light-emitting element 5B is provided in the thin-film transistor layer 4 including the transistors TR, for each of the red subpixel RSP, green subpixel GSP and blue subpixel BSP. It is noted that the control circuit including the transistor TR, provided for each of the red subpixel RSP, green subpixel GSP and blue subpixel BSP, and the light-emitting element are together referred also to as a subpixel circuit.

The red light-emitting element 5R, green light-emitting element 5G and blue light-emitting element 5B illustrated in FIG. 2 may fall under a top-emission type or a bottom-emission type. Since the red light-emitting element 5R, the green light-emitting element 5G and the blue light-emitting element 5B have a forward stacked structure where the first electrode 22 (anode), the function layer 24R, 24G or 24B, and the second electrode 25 (cathode) are formed in the stated order on the substrate 12, the second electrode 25 (cathode) is disposed over the first electrode 22 (anode); accordingly, for a top-emission type, the first electrode 22 (anode) needs to be formed of an electrode material the reflects visible light, and the second electrode 25 (cathode) needs to be formed of an electrode material that passes visible light; in addition, for a bottom-emission type, the first electrode 22 (anode) needs to be formed of an electrode material that passes visible light, and the second electrode 25 (cathode) needs to be formed of an electrode material that reflects visible light.

The electrode material that reflects visible light may be any material that can reflect visible light and that is conductive; examples include a metal material, such as Al, Mg, Li or Ag, an alloy of the foregoing metal material, a stack of the foregoing metal material and a transparent metal oxide (e.g., an indium tin oxide, an indium zinc oxide, and an indium gallium zinc oxide), and a stack of the foregoing alloy and transparent metal oxide.

On the other hand, the electrode material that passes visible light may be any material that can pass visible light and that is conductive; examples include a transparent metal oxide (e.g., an indium tin oxide, an indium zinc oxide, and an indium gallium zinc oxide), and a thin film made of a metal material, such as Al, Mg, Li or Ag.

The first electrode 22 (anode) and the second electrode 25 (cathode) can be formed through a typical method of electrode formation; examples include physical vapor deposition (PVD), such as vacuum evaporation, sputtering, EB evaporation and ion plating, and chemical vapor deposition (CVD). Further, pattering the first electrode 22 (anode) and the second electrode 25 (cathode) may be performed in any method through which these electrodes can be formed into their desired patterns accurately; specific examples include photolithography and ink-jet printing.

The sealing layer 6 is a light-transparency film and can be composed of, for instance, an inorganic sealing film 26 covering the second electrode 25 (cathode), an organic film 27 over the inorganic sealing film 26, and an inorganic sealing film 28 over the organic film 27. The sealing layer 6 avoids foreign substances, such as water and oxygen, from permeating the red light-emitting element 5R, the green light-emitting element 5G and the blue light-emitting element 5B.

The inorganic sealing film 26 and the inorganic sealing film 28 are each an inorganic film and can be composed of, for instance, a silicon oxide film, a silicon nitride film or a silicon oxide nitride film, all of which are formed through CVD, or a laminate of these films. The organic film 27 is a light-transparency organic film having a flattening effect and can be composed of, for instance, an organic material that can be applied, such as acrylic. The organic film 27 may be formed through, for instance, ink-jet printing. Although this embodiment describes, by way of example, an instance where the sealing layer 6 is formed of two inorganic films and one organic film provided between the two inorganic films, the order of stacking two inorganic films and one organic film is not limited to what is described herein. Furthermore, the sealing layer 6 may be composed of only an inorganic film, composed of only an organic film, composed of one inorganic film and two organic films or composed of two or more inorganic films and two or more organic films.

The function film 39 is a film that has at least one of, for instance, the function of optical compensation, the function of touch sensing and the function of protection.

Figure 3:
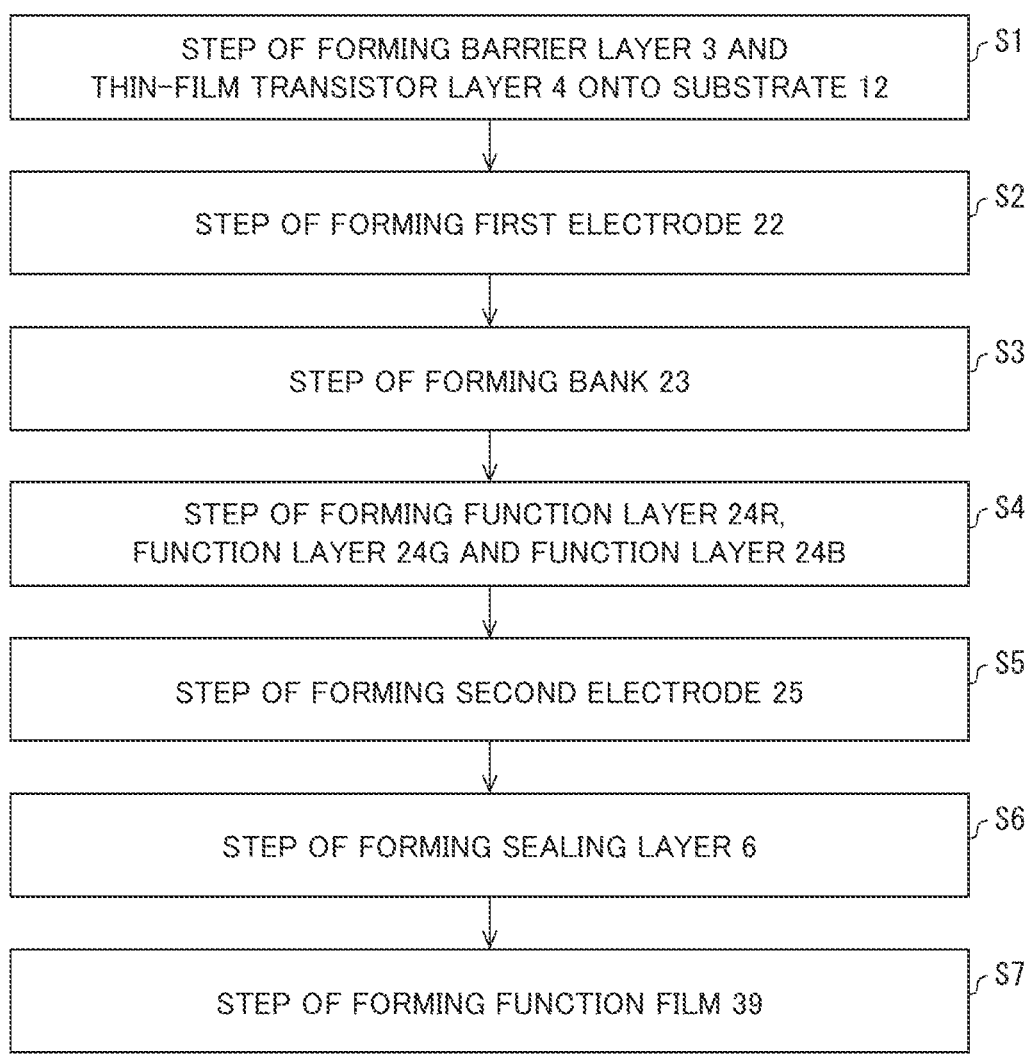
FIG. 3 illustrates process steps for manufacturing the display device in the first embodiment.
Figure 4:
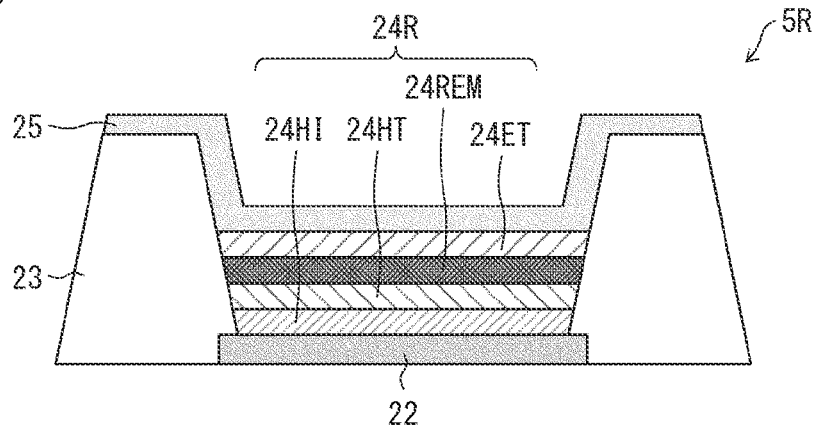
FIG. 4(a) is a sectional view of the schematic configuration of a red light-emitting element included in the display device in the first embodiment.
FIG. 4(b) is a sectional view of the schematic configuration of a green light-emitting element included in the display device in the first embodiment.
FIG. 4(c) is a sectional view of the schematic configuration of a blue light-emitting element included in the display device in the first embodiment.
Figure 4:
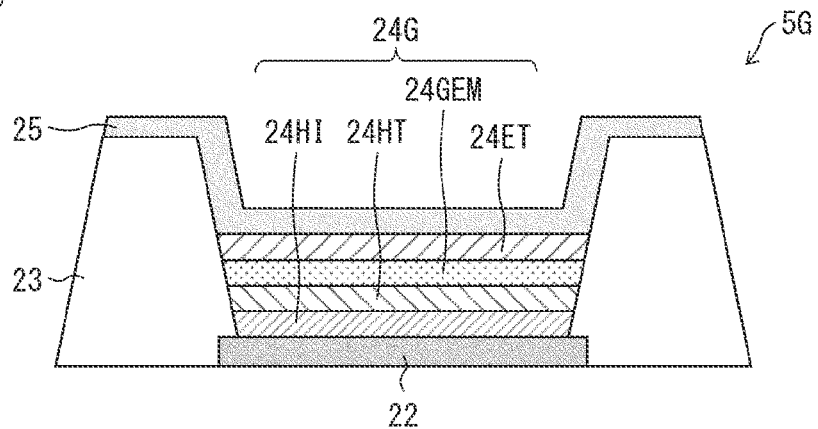
Figure 4:
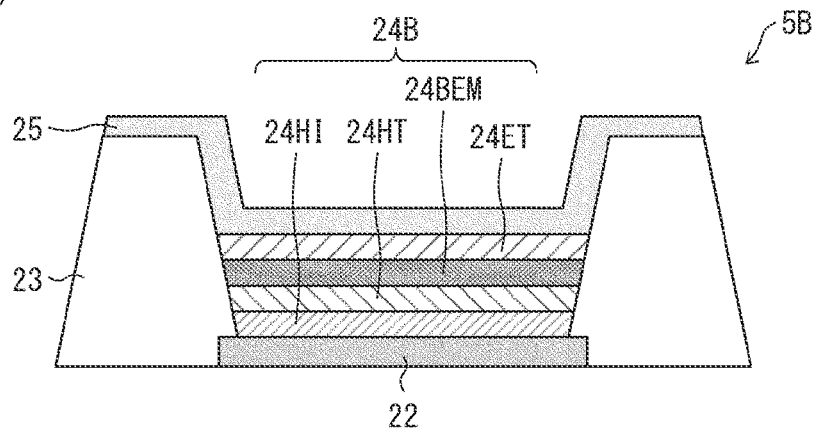

FIG. 3 illustrates process steps for manufacturing the display device 1 in the first embodiment.

The process steps for manufacturing the display device 1 illustrated in FIG. 2 include the following, as illustrated in FIG. 3: a step (S1) of forming the barrier layer 3 and the thin-film transistor layer 4 onto the substrate 12; a step (S2) of forming the first electrode 22 (anode); a step (S3) of forming the bank 23 (transparent resin layer); a step (S4) of forming the function layer 24R including the red light-emitting layer, included in the red light-emitting element 5R, the function layer 24G including the green light-emitting layer, included in the green light-emitting element 5G, and the function layer 24B including the blue light-emitting layer, included in the blue light-emitting element 5B; a step (S5) of forming the second electrode 25 (cathode); a step (S6) of forming the sealing layer 6; and a step (S7) of forming the function film 39.

FIG. 4(a) is a sectional view of the schematic configuration of the red light-emitting element 5R, included in the display device 1 in the first embodiment, FIG. 4(b) is a sectional view of the schematic configuration of the green light-emitting element 5G, included in the display device 1 in the first embodiment, and FIG. 4(c) is a sectional view of the schematic configuration of the blue light-emitting element 5B, included in the display device 1 in the first embodiment.

Figure 5:
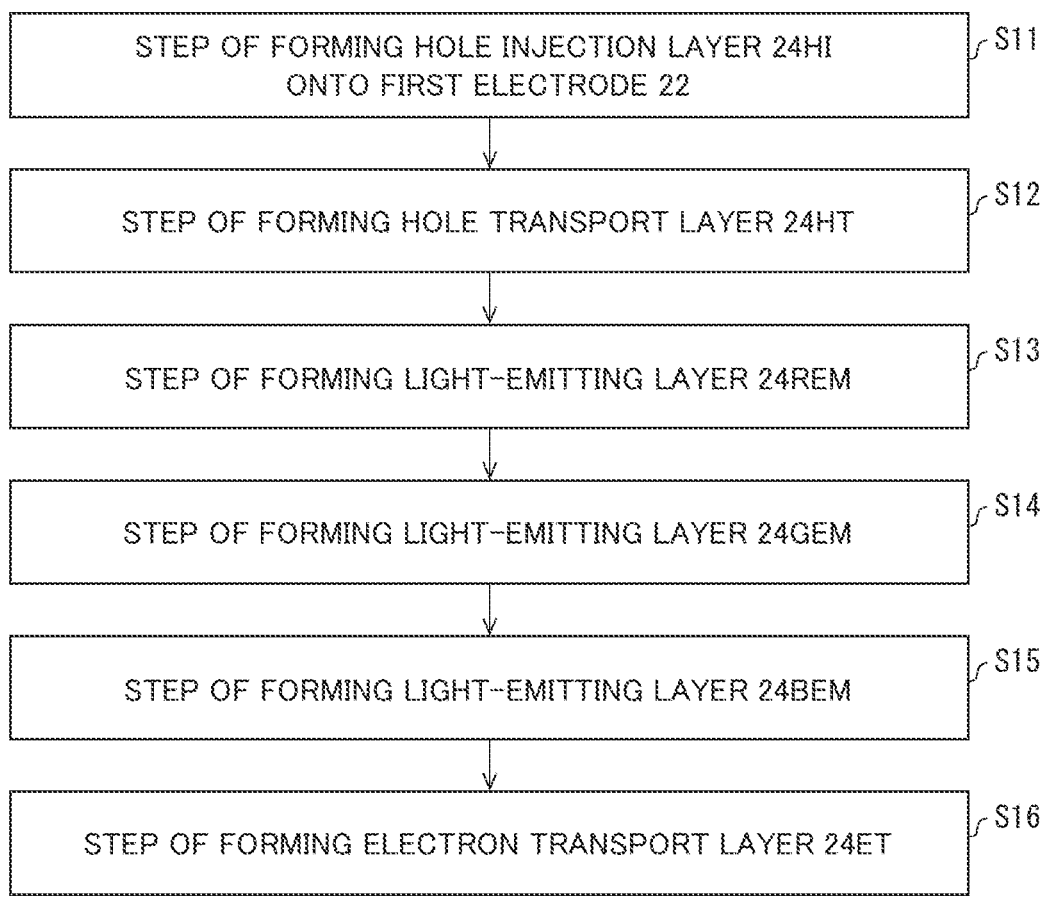
FIG. 5 illustrates process steps for forming individual function layers in the process steps for manufacturing the display device in the first embodiment illustrated in FIG. 3.
Figure 6:
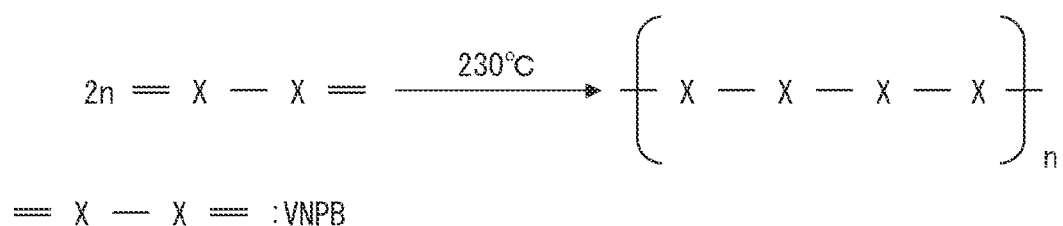
FIG. 6(a) illustrates a 3D-mesh-structured high molecular material obtained by heating VNPB contained in a hole transport layer included in the display device in the first embodiment.
FIG. 6(b) illustrates a 3D-mesh-structured high molecular material obtained by heating DV-CBP contained in a hole transport layer included in a modified version of the display device in the first embodiment.
FIG. 6(c) illustrates a 3D-mesh-structured high molecular material obtained by heating CBP-V contained in a hole transport layer included in another modified version of the display device in the first embodiment.
Figure 6:
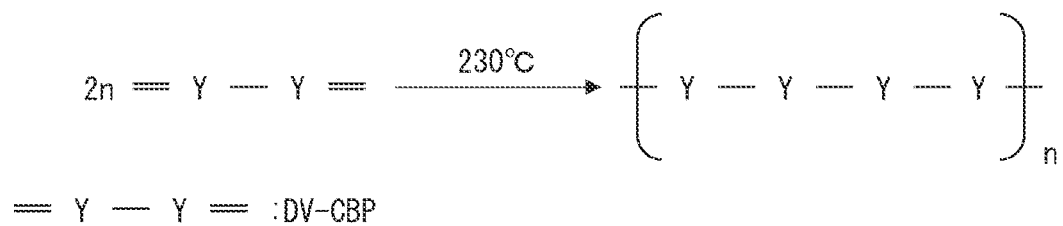
Figure 6:
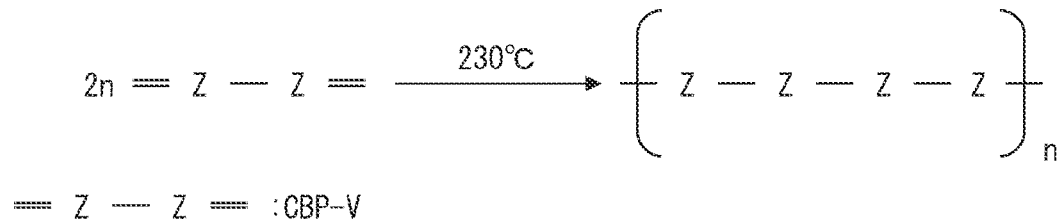
Figure 7:
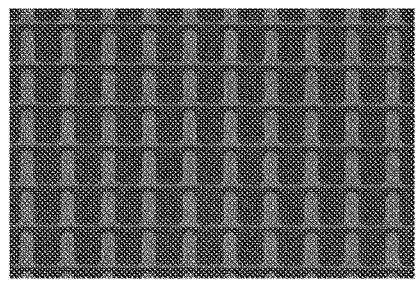
FIG. 7(a) illustrates the solvent resistance characteristic of a hole transport layer with the weight ratio between a first hole transport material having a 3D mesh structure where VNPBs are joined together through a heat treatment at 230° C. to constitute a high molecule and a second hole transport material containing polyvinyl carbazole (PVK) standing at 1:2.
FIG. 7(b) illustrates the solvent resistance characteristic of a hole transport layer with the weight ratio between a first hole transport material having a 3D mesh structure where VNPBs are joined together through a heat treatment at 230° C. to constitute a high molecule and a second hole transport material containing polyvinyl carbazole (PVK) standing at 1:1.
FIG. 7(c) illustrates the solvent resistance characteristic of a hole transport layer containing only a second hole transport material containing polyvinyl carbazole (PVK) undergone a heat treatment at 230° C.
Figure 7:
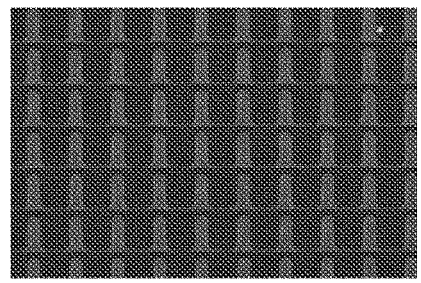
Figure 7:
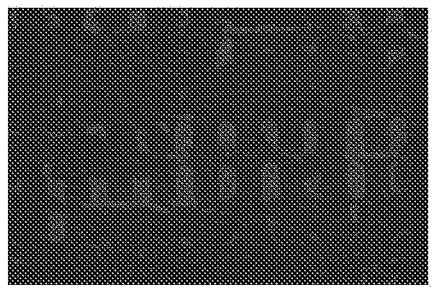

FIG. 5 illustrates process steps for forming the function layer 24R, function layer 24G and function layer 24B in the process steps for manufacturing the display device 1 in the first embodiment illustrated in FIG. 3.

As illustrated in FIG. 5, the process steps for forming the function layer 24R, function layer 24G and function layer 24B, included in the display device 1, includes the following: a step (S11) of forming a hole injection layer 24HI onto the first electrode 22 (anode); a step (S12) of forming a hole transport layer 24HT; a step (S13) of forming a light-emitting layer 24REM (red light-emitting layer); a step (S14) of forming a light-emitting layer 24GEM (green light-emitting layer); a step (S15) of forming a light-emitting layer 24BEM (blue light-emitting layer); and a step (S16) of forming an electron transport layer 24ET.

Although this embodiment describes, by way of example, an instance where the light-emitting layer 24REM (red light-emitting layer), the light-emitting layer 24GEM (green light-emitting layer) and the light-emitting layer 24BEM (blue light-emitting layer) are formed in the stated order, these light-emitting layers may be formed in any order.

Further, as earlier described, the individual function layer 24R, function layer 24G and function layer 24B in this embodiment includes their respective hole injection layers 24HI made of the same material and formed in the same process step, their respective hole transport layers 24HT made of the same material and formed in the same process step, and their respective electron transport layers 24ET made of the same material and formed in the same process step. Thus, the hole injection layer 24HI is formed onto the first electrode 22 (anode), included in each of the red light-emitting element 5R, green light-emitting element 5G, and blue light-emitting element 5B, in the step (S11) of forming the hole injection layer 24HI onto the first electrode 22 (anode). Further, the hole transport layer 24HT is formed onto the hole injection layer 24HI, included in each of the light-emitting element 5R, green light-emitting element 5G, and blue light-emitting element 5B, in the step (S12) of forming the hole transport layer 24HT. Furthermore, the electron transport layer 24ET is formed onto the light-emitting layer 24REM (red light-emitting layer), included in the red light-emitting element 5R, onto the light-emitting layer 24GEM (green light-emitting layer), included in the green light-emitting element 5G, and onto the light-emitting layer 24BEM (blue light-emitting layer), included in the blue light-emitting element 5B, in the step (S16) of forming the electron transport layer 24ET.

It is noted that the first electrode 22 (anode) can be formed with a non-limiting thickness of, for instance, 100 to 300 nm inclusive. The second electrode 25 (cathode) can be formed with a non-limiting thickness of, for instance, 10 to 100 nm inclusive. The hole injection layer 24HI can be formed with a non-limiting thickness of, for instance, 20 to 90 nm inclusive. The hole transport layer 24HT can be formed with a non-limiting thickness of, for instance, 20 to 70 nm inclusive. The light-emitting layer 24REM (red light-emitting layer), the light-emitting layer 24GEM (green light-emitting layer) and the light-emitting layer 24BEM (blue light-emitting layer) can be formed with a non-limiting thickness of, for instance, 20 to 50 nm inclusive. The electron transport layer 24ET can be formed with a non-limiting thickness of, for instance, 30 to 90 nm inclusive.

As described later on, the hole transport layer 24HT contains a first hole transport material having a 3D mesh structure with molecules including a hole-transportability skeleton and at least two thermosetting functional groups being joined together to constitute a high molecule and contains a second hole transport material including a plurality of molecules having hole transportability.

Each of the red light-emitting element 5R, green light-emitting element 5G and blue light-emitting element 5B included in the display device 1 in this embodiment includes the hole transport layer 24HT containing the first hole transport material and second hole transport material. The second hole transport material, contained in the hole transport layer 24HT and including a plurality of molecules having hole transportability, includes a plurality of hole-transportability molecules containing no thermosetting functional group and other things and thus has a higher hole transport characteristic than the first hole transport material. An example of the second hole transport material including a plurality of molecules having hole transportability is a high molecular material having hole transportability; non-limiting suitable usable examples of the high molecular material include polyvinyl carbazole (PVK), poly[(9,9-dioctylfluorenyl-2,7-dyl)-co-(4,4'-(N-(4-sec-butylphenyl) (TFB). As the second hole transport material including a plurality of molecules having hole transportability, a low molecular material having hole transportability may be used for instance, or both of a high molecular material having hole transportability and a low molecular material having hole transportability may be used for instance. On the other hand, the first hole transport material, included in the hole transport layer 24HT, has a 3D mesh structure and thus has a higher solvent resistance characteristic than the second hole transport material. As described above, the hole transport layer 24HT contains a mixture of the first hole transport material, having a higher solvent resistance characteristic, and the second hole transport material, having a higher hole transport characteristic, thereby achieving a light-emitting element and a display device that are provided with a hole transport layer having a satisfactory solvent resistance characteristic and a satisfactory hole transport characteristic.

Although this embodiment describes, by way of example, all the red light-emitting element 5R, green light-emitting element 5G and blue light-emitting element 5B, included in the display device 1, include the hole transport layer 24HT containing the first hole transport material and second hole transport material, one or more of the red light-emitting element 5R, green light-emitting element 5G and blue light-emitting element 5B, included in the display device 1, may include the hole transport layer 24HT containing the first hole transport material and second hole transport material.

FIG. 6(a) illustrates a 3D-mesh-structured high molecular material obtained by heating N4,N4'-Di(naphthalen-1-yl)-N4,N4'-bis(4-vinylphenyl)biphenyl-4,4'-diamine (VNPB) contained in the hole transport layer 24HT, included in the display device 1 in the first embodiment.

It is noted that the VNPB expressed by the following (Chemical Formula 1) has a hole-transportability skeleton (X-X), and a vinyl group as a thermosetting functional group. It is noted that the VNPB's hole-transportability skeleton is denoted by X-X in FIG. 6(a).

[Chemical 1]

(Chemical Formula 1)

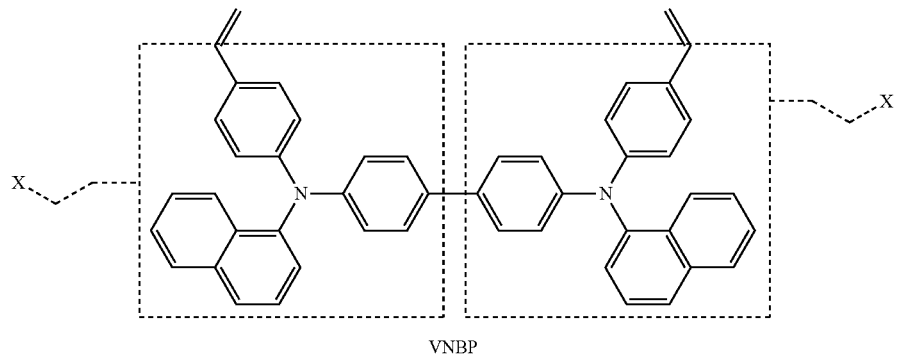

VNBP

FIG. 6(b) illustrates a 3D-mesh-structured high molecular material obtained by heating 4,4'-Bis(3-((4-vinylphenoxy)methyl)-9H-carbazol-9-yl)biphenyl (DV-CBP) contained in a hole transport layer included in a modified version of the display device in the first embodiment.

It is noted that the DV-CBP expressed by the following (Chemical Formula 2) has a hole-transportability skeleton (Y-Y), and a vinyl group as a thermosetting functional group. It is noted that the DV-CBP's hole-transportability skeleton is denoted by Y-Y in FIG. 6(b).

[Chemical 2]

(Chemical Formula 2)

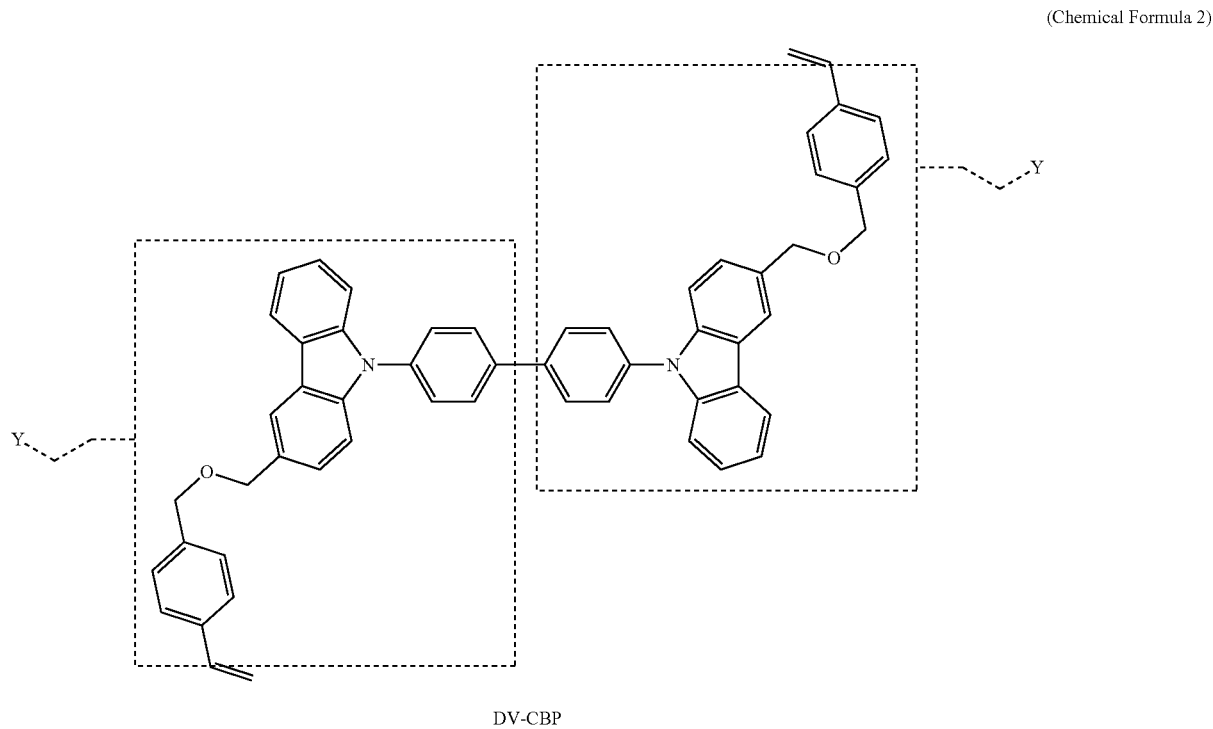

DV-CBP

FIG. 6(c) illustrates a 3D-mesh-structured high molecular material obtained by heating 4,4'-bis(N-carbazolyl)-1,1'-biphenyl-vinyl (CBP-V) contained in a hole transport layer included in another modified version of the display device in the first embodiment.

It is noted that the CBP-V expressed by the following (Chemical Formula 3) has a hole-transportability skeleton (Z-Z), and a vinyl group as a thermosetting functional group. It is noted that the CBP-V's hole-transportability skeleton is denoted by Z-Z in FIG. 6(c).

[Chemical 3]

(Chemical Formula 3)

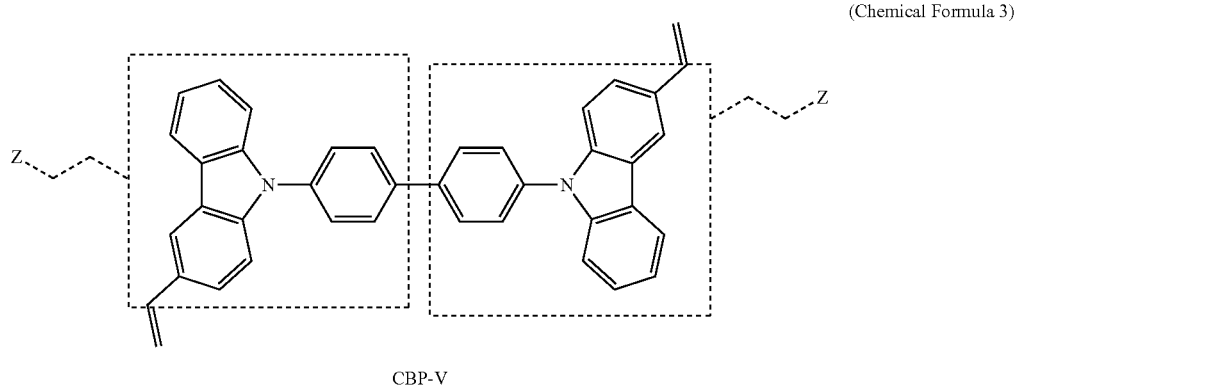

CBP-V

The VNPB illustrated in FIG. 6(a), the DV-CBP illustrated in FIG. 6(b) and the CBP-V illustrated in FIG. 6(c) are example precursors (precursor molecules) of the 3D-mesh-structured first hole transport material contained in the hole transport layer 24HT, and these precursors (precursor molecules) all have a vinyl group as a thermosetting functional group; accordingly, a heat treatment at 230° C. under an inert gas (e.g., a nitrogen gas or an argon gas) atmosphere for instance can provide a first hole transport material having a 3D mesh structure with precursors (precursor molecules) joined together to constitute a high molecule.

As such, the step (S12) of forming the hole transport layer 24HT illustrated in FIG. 5 includes a step of forming a hole-transport-material-mixed solution containing precursors (precursor molecules), such as VNPB, DV-CBP or CBP-V, a plurality of molecules having hole transportability, and a solvent onto the first electrode 22 (anode), to be specific, onto the hole injection layer 24HI on the first electrode 22 (anode), followed by a heat treatment to transform the precursors (precursor molecules) into a 3D-mesh-structured high molecular material. It is noted that the solvent contained in the hole-transport-material-mixed solution may be any kind that can dissolve or disperse the precursors (precursor molecules) and the plurality of hole-transportability molecules; in this embodiment, chlorobenzene is used.

This embodiment describes a non-limiting instance where a heat treatment at 230° C. is performed so as to join the foregoing precursors (precursor molecules) together to constitute a high molecule. The foregoing heat treatment for joining the precursors (precursor molecules) together to constitute a high molecule is preferably performed at 120 to 230° C. inclusive in view of performance degradation of the hole injection layer 24HI resulting from this heat treatment.

An increase in the weight of the second hole transport material, contained in the hole transport layer 24HT and having a higher hole transport characteristic, improves the hole transport characteristic of the hole transport layer 24HT, but decreases accordingly the weight of the first hole transport material, contained in the hole transport layer 24HT and having a higher solvent resistance characteristic, and the solvent resistance characteristic of the hole transport layer 24HT thus lowers. Hence, to optimize the hole transport characteristic and solvent resistance characteristic of the hole transport layer 24HT, the weight of the second hole transport material, contained in the hole transport layer 24HT and having a higher hole transport characteristic, is preferably larger than the weight of the first hole transport material, contained in the hole transport layer 24HT and having a higher solvent resistance characteristic, by 1 to 4 times inclusive.

FIG. 7(a) illustrates the solvent resistance characteristic of a hole transport layer with the weight ratio between a first hole transport material having a 3D mesh structure where VNPBs are joined together through a heat treatment at 230° C. to constitute a high molecule and a second hole transport material containing polyvinyl carbazole (PVK) standing at 1:2.

FIG. 7(b) illustrates the solvent resistance characteristic of a hole transport layer with the weight ratio between a first hole transport material having a 3D mesh structure where VNPBs are joined together through a heat treatment at 230° C. to constitute a high molecule and a second hole transport material containing polyvinyl carbazole (PVK) standing at 1:1.

FIG. 7(c) illustrates the solvent resistance characteristic of a hole transport layer containing only a second hole transport material containing polyvinyl carbazole (PVK) undergone a heat treatment at 230° C.

The hole transport layer illustrated in FIG. 7(c) has a high hole transport characteristic immediately after formed, but this hole transport layer, which is made of a high molecular material having no 3D mesh structure, exhibits a poor solvent resistance characteristic even when subjected to a heat treatment at a temperature over a glass-transition temperature to be crystallized again, and the hole transport layer is thus peeled off by a solvent that is used in a posterior process step and is consequently difficult to use.

On the other hand, the hole transport layers illustrated in FIG. 7(a) and FIG. 7(b) have a satisfactory solvent resistance characteristic and a satisfactory hole transport characteristic. It is noted that the hole transport layer illustrated in FIG. 7(b) has a higher solvent resistance characteristic than the hole transport layer illustrated in FIG. 7(a), and that the hole transport layer illustrated in FIG. 7(a) has a higher hole transport characteristic than the hole transport layer illustrated in FIG. 7(b).

As described above, although this embodiment has described, by way of example, an instance where polyvinyl carbazole (PVK) is used as the second hole transport material containing a plurality of molecules having hole transportability, an organic hole transport material, such as poly[(9,9-dioctylfluorenyl-2,7-dyl)-co-(4,4'-(N-(4-sec-butylphenyl))diphenylamine)](TFB), may be used as the second hole transport material.

FIG. 8(a), FIG. 8(b), FIG. 8(c), FIG. 8(d), FIG. 8(e), FIG. 8(f) and FIG. 8(g) illustrate process steps for forming the red light-emitting layer 24REM of the red light-emitting element 5R, included in the red subpixel RSP provided in the display device 1 in the first embodiment.

As illustrated in FIG. 8(a) and FIG. 8(b), a first resist layer 30 is formed onto at least the hole transport layer 24HT of the red light-emitting element 5R, included in the red subpixel RSP, the hole transport layer 24HT of the green light-emitting element 5G, included in the green subpixel GSP, and the hole transport layer 24HT of the blue light-emitting element 5B, included in the blue subpixel BSP. It is noted that the green light-emitting element 5G, included in the green subpixel GSP, and the blue light-emitting element 5B, included in the blue subpixel BSP, are not illustrated, and that the first resist layer 30 is a layer formed of a positive resist material and can be formed with a thickness of, for instance, 500 to 2500 nm inclusive.

Thereafter, a first region of the first resist layer 30 overlapping, in plan view, the hole transport layer 24HT of the red light-emitting element 5R, included in the red subpixel RSP, undergoes exposure to exposure light L via an opening K1 of a mask M1, followed by development, as illustrated in FIG. 8(c), thus forming a first opening in the first region of the first resist layer 30, as illustrated in FIG. 8(d). It is noted that the foregoing development step can use a tetramethyl ammonium hydroxide (TMAH) aqueous solution for instance.

The next is forming the red light-emitting layer 24REM onto the hole transport layer 24HT in the first opening, formed in the first resist layer 30, as illustrated in FIG. 8(e), and onto the first resist layer 30, included in the red subpixel RSP, green subpixel GSP and blue subpixel BSP, as illustrated in FIG. 8(e) and FIG. 8(f). It is noted that although this embodiment describes, by way of example, an instance where the red light-emitting layer 24REM is a light-emitting layer that includes quantum dots and is formed through application using a spin coater, a slit coater or other things, the method of forming the red light-emitting layer 24REM is not limited to what is described here.

Thereafter, the first resist layer 30 is removed, thus forming the red light-emitting layer 24REM of the red light-emitting element 5R, included in the red subpixel RSP, into a predetermined shape, as illustrated in FIG. 8(g). It is noted that the first resist layer 30 can be removed using a polar solvent in the foregoing removal step, and that a usable example of the polar solvent is propylene glycol monomethyl ether acetate (PGMEA).

As earlier described, the step of forming the red light-emitting layer 24REM uses, in the development step, a TMAH aqueous solution, which comes into direct contact with the hole transport layer 24HT, and uses, in the removal step, a polarity solvent, i.e., PGMEA, which comes into direct contact with the hole transport layer 24HT. Thus, a hole transport layer composed of only a high molecular material, like polyvinyl carbazole (PVK), having hole transportability but having no 3D mesh structure is possibly peeled off by PGMEA and a TMAH aqueous solution, both of which are solvents to be used, in each of the steps of forming a red light-emitting layer, forming a green light-emitting layer and forming a blue light-emitting layer, and the hole transport layer is consequently difficult to use.

On the other hand, each of the red light-emitting element 5R, green light-emitting element 5G and blue light-emitting element 5B included in the display device 1 in the first embodiment includes the hole transport layer 24HT, and the hole transport layer 24HT, which as earlier described, contains a first hole transport material having a 3D mesh structure, and a second hole transport material including a plurality of molecules having hole transportability, has a high solvent resistance characteristic and a high hole transport characteristic. The hole transport layer 24HT has a higher solvent resistance characteristic than a TMAH aqueous solution and PGMEA.

FIG. 9(a), FIG. 9(b), FIG. 9(c), FIG. 9(d), FIG. 9(e), FIG. 9(f) and FIG. 9(g) illustrate process steps for forming the green light-emitting layer 24GEM of the green light-emitting element 5G, included in the green subpixel GSP provided in the display device 1 in the first embodiment.

As illustrated in FIG. 8(g), FIG. 9(a) and FIG. 9(b), a second resist layer 30 is formed onto at least the red light-emitting layer 24REM of the red light-emitting element 5R, included in the red subpixel RSP, and the hole transport layer 24HT of the green light-emitting element 5G, included in the green subpixel GSP, and the hole transport layer 24HT of the blue light-emitting element 5B, included in the blue subpixel BSP. It is noted that the blue light-emitting element 5B, included in the blue subpixel BSP, is not illustrated, and that the second resist layer 30 is a layer formed of a positive resist material and can be formed with a thickness of, for instance, 500 to 2500 nm inclusive.

Thereafter, a second region of the second resist layer 30 overlapping, in plan view, the hole transport layer 24HT of the green light-emitting element 5G, included in the green subpixel GSP, undergoes exposure to exposure light L via an opening K2 of a mask M2, followed by development, as illustrated in FIG. 9(c), thus forming a second opening in the second region of the second resist layer 30, as illustrated in FIG. 9(d). It is noted that the foregoing development step can use a tetramethyl ammonium hydroxide (TMAH) aqueous solution for instance.

The next is forming the green light-emitting layer 24GEM onto the hole transport layer 24HT in the second opening, formed in the second resist layer 30, as illustrated in FIG. 9(e), and onto the second resist layer 30, included in the red subpixel RSP, green subpixel GSP and blue subpixel BSP, as illustrated in FIG. 9(e) and FIG. 9(f). It is noted that although this embodiment describes, by way of example, an instance where the green light-emitting layer 24GEM is a light-emitting layer that includes quantum dots and is formed through application using a spin coater, a slit coater or other things, the method of forming the green light-emitting layer 24GEM is not limited to what is described here.

Thereafter, the second resist layer 30 is removed, thus forming the green light-emitting layer 24GEM of the green light-emitting element 5G, included in the green subpixel GSP, into a predetermined shape, as illustrated in FIG. 9(g). It is noted that the second resist layer 30 can be removed using a polar solvent in the foregoing removal step, and that a usable example of the polar solvent is propylene glycol monomethyl ether acetate (PGMEA).

As earlier described, the step of forming the green light-emitting layer 24GEM uses, in the development step, a TMAH aqueous solution, which comes into direct contact with the hole transport layer 24HT, and uses, in the removal step, a polarity solvent, i.e., PGMEA, which comes into direct contact with the hole transport layer 24HT.

Each of the red light-emitting element 5R, green light-emitting element 5G and blue light-emitting element 5B included in the display device 1 in the first embodiment includes the hole transport layer 24HT, and the hole transport layer 24HT, which as earlier described, contains a first hole transport material having a 3D mesh structure, and a second hole transport material including a plurality of molecules having hole transportability, has a high solvent resistance characteristic and a high hole transport characteristic. The hole transport layer 24HT has a higher solvent resistance characteristic than a TMAH aqueous solution and PGMEA.

FIG. 10(a), FIG. 10(b), FIG. 10(c), FIG. 10(d), FIG. 10(e) and FIG. 10(f) illustrate process steps for forming the blue light-emitting layer 24BEM of the blue light-emitting element 5B, included in the blue subpixel BSP provided in the display device 1 in the first embodiment.

As illustrated in FIG. 8(g), FIG. 9(g), FIG. 10(a) and FIG. 10(b), a third resist layer 30 is formed onto at least the red light-emitting layer 24REM of the red light-emitting element 5R, included in the red subpixel RSP, the green light-emitting layer 24GEM of the green light-emitting element 5G, included in the green subpixel GSP, and the hole transport layer 24HT of the blue light-emitting element 5B, included in the blue subpixel BSP. It is noted that the third resist layer 30 is a layer formed of a positive resist material and can be formed with a thickness of, for instance, 500 to 2500 nm inclusive.

Thereafter, a third region of the third resist layer 30 overlapping, in plan view, the hole transport layer 24HT of the blue light-emitting element 5B, included in the blue subpixel BSP, undergoes exposure to exposure light L via an opening K3 of a mask M3, followed by development, as illustrated in FIG. 10(c), thus forming a third opening in the third region of the third resist layer 30, as illustrated in FIG. 10(d). It is noted that the foregoing development step can use a tetramethyl ammonium hydroxide (TMAH) aqueous solution for instance.

The next is forming the blue light-emitting layer 24BEM onto the hole transport layer 24HT in the third opening, formed in the third resist layer 30, and onto the third resist layer 30, included in the red subpixel RSP, green subpixel GSP and blue subpixel BSP, as illustrated in FIG. 10(e). It is noted that although this embodiment describes, by way of example, an instance where the blue light-emitting layer 24BEM is a light-emitting layer that includes quantum dots and is formed through application using a spin coater, a slit coater or other things, the method of forming the blue light-emitting layer 24BEM is not limited to what is described here.

Thereafter, the third resist layer 30 is removed, thus forming the blue light-emitting layer 24BEM of the blue light-emitting element 5B, included in the blue subpixel BSP, into a predetermined shape, as illustrated in FIG. 10(f). It is noted that the third resist layer 30 can be removed using a polar solvent in the foregoing removal step, and that a usable example of the polar solvent is propylene glycol monomethyl ether acetate (PGMEA).

As earlier described, the step of forming the blue light-emitting layer 24BEM uses, in the development step, a TMAH aqueous solution, which comes into direct contact with the hole transport layer 24HT, and uses, in the removal step, a polarity solvent, i.e., PGMEA, which comes into direct contact with the hole transport layer 24HT.

Each of the red light-emitting element 5R, green light-emitting element 5G and blue light-emitting element 5B included in the display device 1 in the first embodiment includes the hole transport layer 24HT, and the hole transport layer 24HT, which as earlier described, contains a first hole transport material having a 3D mesh structure, and a second hole transport material including a plurality of molecules having hole transportability, has a high solvent resistance characteristic and a high hole transport characteristic. The hole transport layer 24HT has a higher solvent resistance characteristic than a TMAH aqueous solution and PGMEA.

Figure 8:
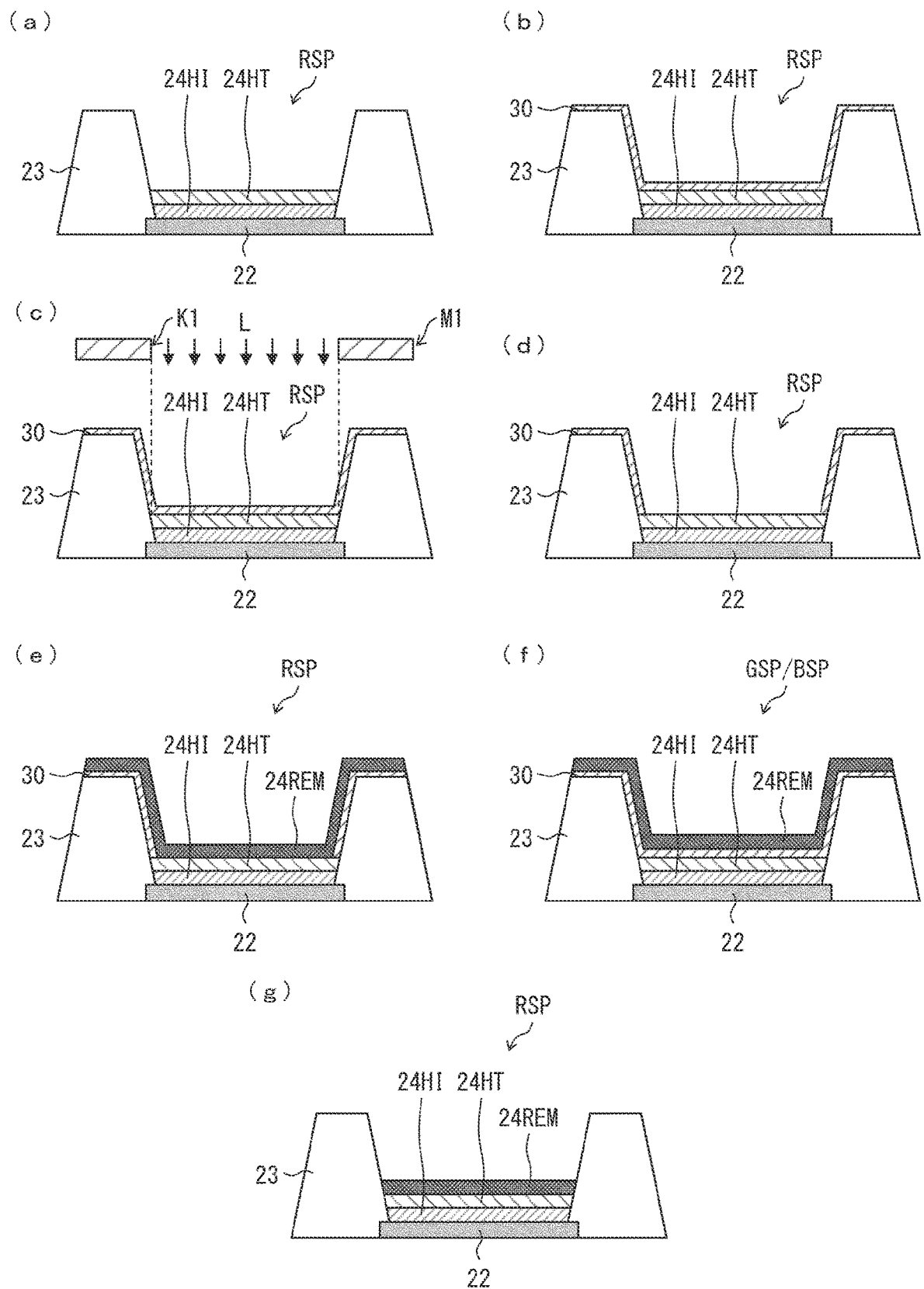
FIG. 8(a), FIG. 8(b), FIG. 8(c), FIG. 8(d), FIG. 8(e), FIG. 8(f) and FIG. 8(g) illustrate process steps for forming the red light-emitting layer of the red light-emitting element included in a red subpixel included in the display device in the first embodiment.
Figure 9:
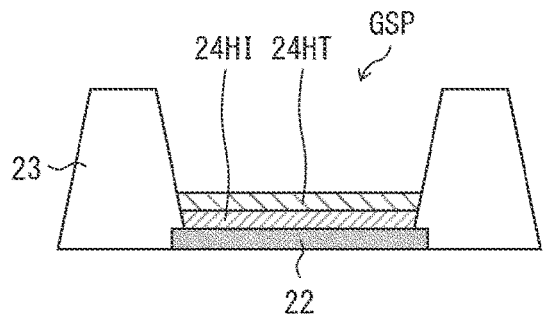
FIG. 9(a), FIG. 9(b), FIG. 9(c), FIG. 9(d), FIG. 9(e), FIG. 9(f) and FIG. 9(g) illustrate process steps for forming the green light-emitting layer of the green light-emitting element included in a green subpixel included in the display device in the first embodiment.
Figure 9:
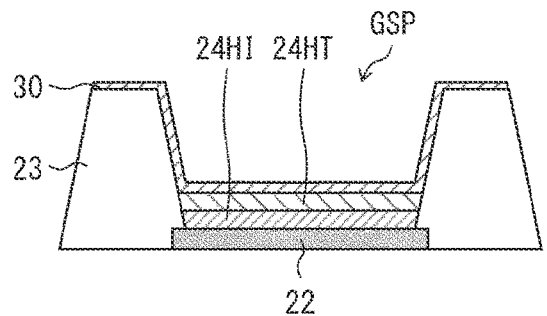
Figure 9:
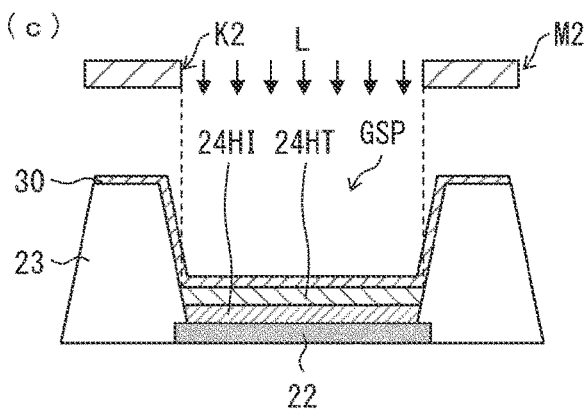
Figure 9:
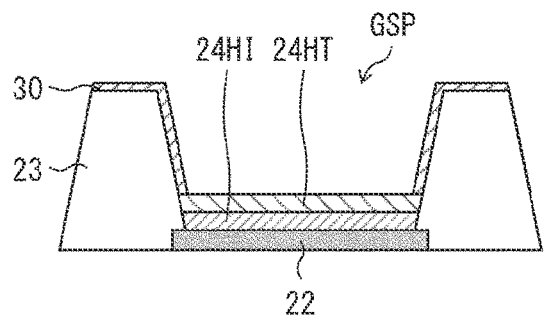
Figure 9:
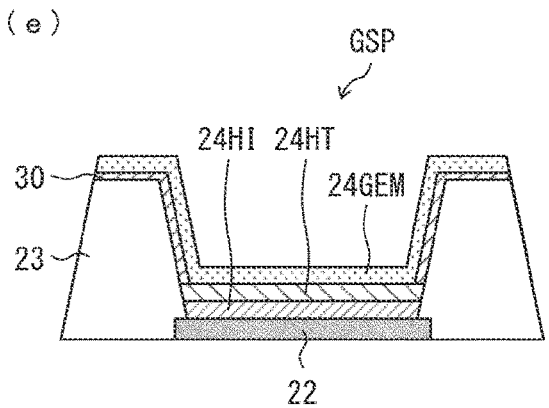
Figure 9:
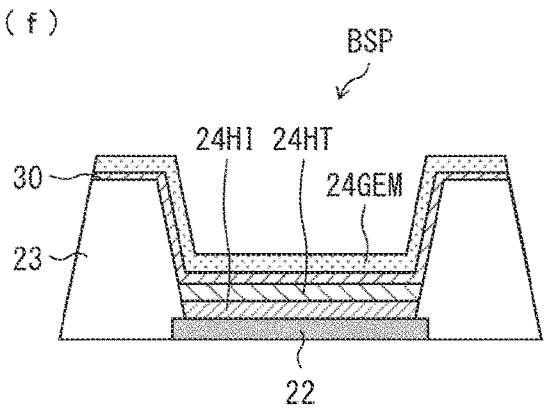
Figure 9:
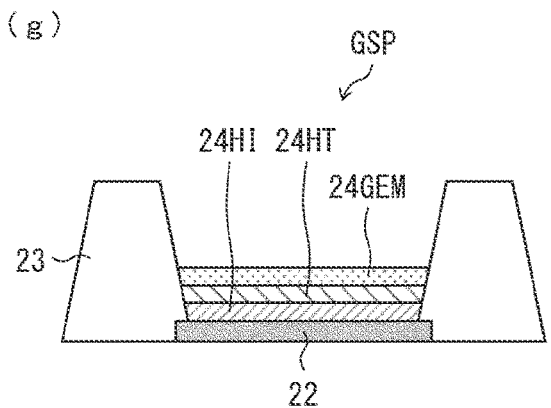
Figure 10:
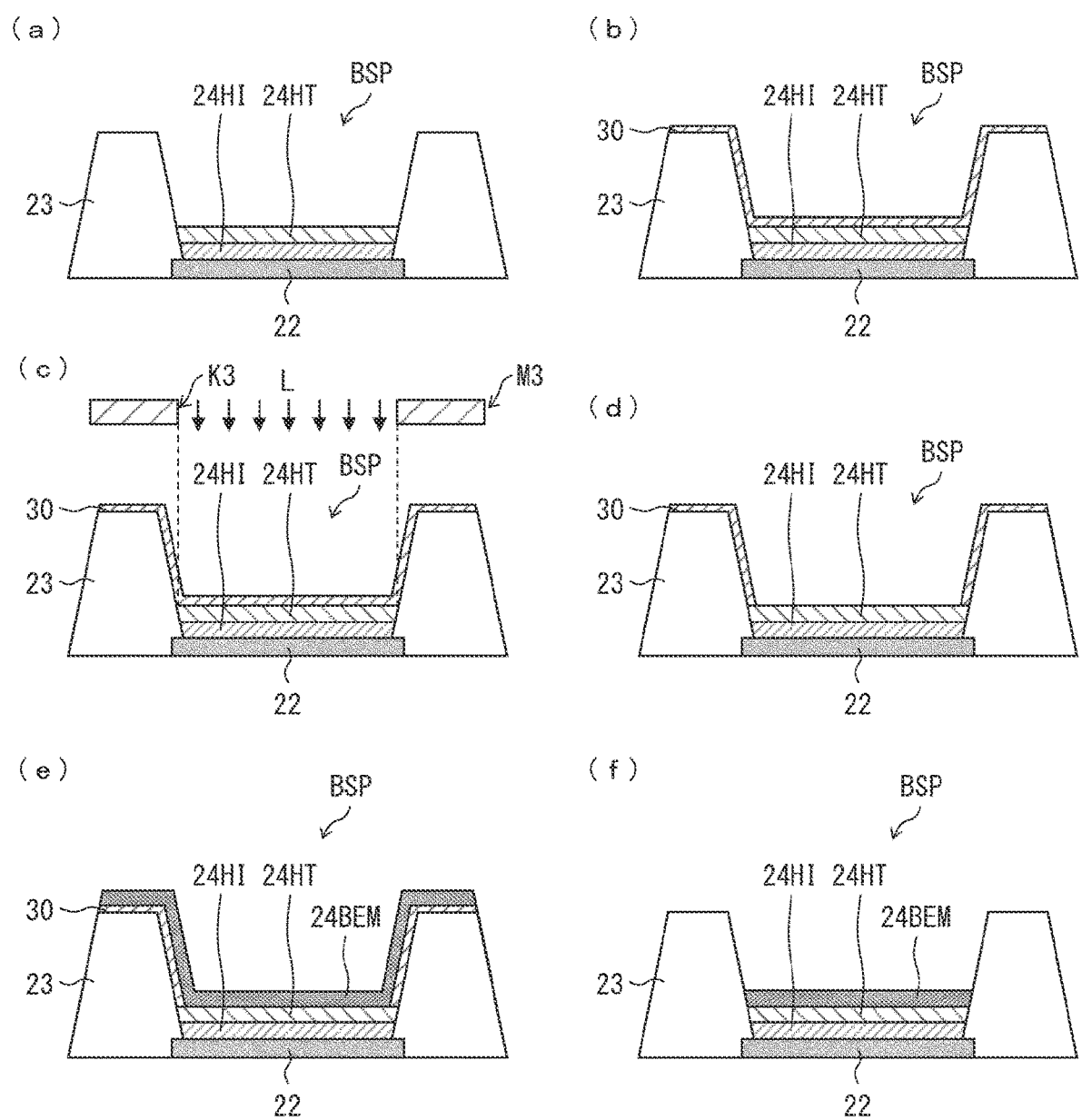
FIG. 10(a), FIG. 10(b), FIG. 10(c), FIG. 10(d), FIG. 10(e) and FIG. 10(f) illustrate process steps for forming the blue light-emitting layer of the blue light-emitting element included in a blue subpixel included in the display device in the first embodiment.

As described above, the process steps for forming the red light-emitting layer 24REM, green light-emitting layer 24GEM and blue light-emitting layer 24BEM through a liftoff method using the first resist layer 30, second resist layer 30 and third resist layer 30, described on the basis of FIG. 8 through FIG. 10, use a TMAH aqueous solution and PGMEA three times each, thus achieving a greater effect that is brought by the hole transport layer 24HT having a higher solvent resistance characteristic than the TMAH aqueous solution and PGMEA. Although this embodiment describes, by way of example, an instance where the red light-emitting layer 24REM, the green light-emitting layer 24GEM and the blue light-emitting layer 24BEM are formed in the stated order, these light-emitting layers may be formed in any order.

Further, although this embodiment describes, by way of example, an instance where the red light-emitting layer 24REM, the green light-emitting layer 24GEM and the blue light-emitting layer 24BEM are light-emitting layers that include quantum dots and are formed through application using a spin coater, a slit coater or other things, the red light-emitting layer 24REM, the green light-emitting layer 24GEM and the blue light-emitting layer 24BEM may be organic light-emitting layers formed through evaporation. In this case, the red light-emitting layer 24REM can be formed into a predetermined shape by forming the red light-emitting layer 24REM onto the entire hole transport layer 24HT in the first opening of the first resist layer 30 and onto the entire first resist layer 30 through evaporation, followed by removing the first resist layer 30; moreover, the green light-emitting layer 24GEM can be formed into a predetermined shape by forming the green light-emitting layer 24GEM onto the entire hole transport layer 24HT in the second opening of the second resist layer 30 and onto the entire second resist layer 30 through evaporation, followed by removing the second resist layer 30; moreover, the blue light-emitting layer 24BEM can be formed into a predetermined shape by forming the blue light-emitting layer 24BEM onto the entire hole transport layer 24HT in the third opening of the third resist layer 30 and onto the entire third resist layer 30 through evaporation, followed by removing the third resist layer 30.

Further, although this embodiment describes, by way of example, an instance where the red light-emitting layer 24REM, the green light-emitting layer 24GEM and the blue light-emitting layer 24BEM are light-emitting layers that include quantum dots and are formed through application using a spin coater, a slit coater or other things, the red light-emitting layer 24REM, the green light-emitting layer 24GEM and the blue light-emitting layer 24BEM may include a positive photosensitive resist or a negative photosensitive resist. In this case, the red light-emitting layer 24REM, the green light-emitting layer 24GEM and the blue light-emitting layer 24BEM include their photosensitive resists, thus eliminating the need for using the first resist layer 30, the second resist layer 30 and the third resist layer 30. For instance, the red light-emitting layer 24REM can be formed through patterning into a predetermined shape by forming a red light-emitting material solution (first light-emitting material solution) containing quantum dots (first light-emitting material) that emit red light, a photosensitive resist, and a solvent onto the hole transport layer 24HT, followed by exposure and development. Further, the green light-emitting layer 24GEM can be formed through patterning into a predetermined shape by forming a green light-emitting material solution (second light-emitting material solution) containing quantum dots (second light-emitting material) that emit green light, a photosensitive resist, and a solvent onto the red light-emitting layer 24REM and the hole transport layer 24HT, followed by exposure and development. Furthermore, the blue light-emitting layer 24BEM can be formed through patterning into a predetermined shape by forming a blue light-emitting material solution (third light-emitting material solution) containing quantum dots (third light-emitting material) that emit blue light, a photosensitive resist, and a solvent onto the red light-emitting layer 24REM, the green light-emitting layer 24GEM and the hole transport layer 24HT, followed by exposure and development.

As described above, even in the process steps for forming the red light-emitting layer 24REM, green light-emitting layer 24GEM and blue light-emitting layer 24BEM through photolithography patterning, the process steps of forming the solvent-containing red light-emitting material solution (first light-emitting material solution), the solvent-containing green light-emitting material solution (second light-emitting material solution) and the solvent-containing blue light-emitting material solution (third light-emitting material solution), as well as their respective development steps use a polar solvent and a developer, thus achieving a great effect that is brought by the hole transport layer 24HT having a high solvent resistance characteristic.

Second Embodiment

Figure 11:
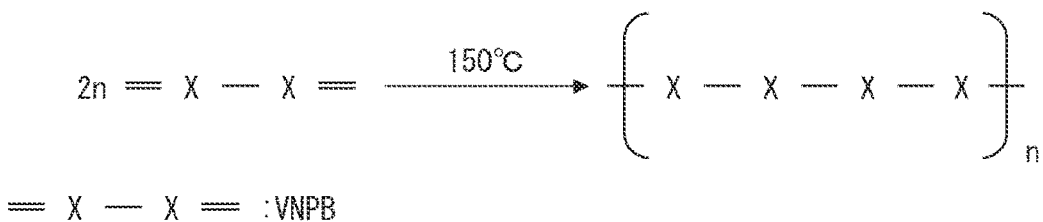
FIG. 11(a) illustrates a 3D-mesh-structured high molecular material obtained by heating VNPB contained in a hole transport layer included in a display device in a second embodiment.
FIG. 11(b) illustrates a 3D-mesh-structured high molecular material obtained by heating DV-CBP contained in a hole transport layer included in a modified version of the display device in the second embodiment.
FIG. 11(c) illustrates a 3D-mesh-structured high molecular material obtained by heating CBP-V contained in a hole transport layer included in another modified version of the display device in the second embodiment.
Figure 11:
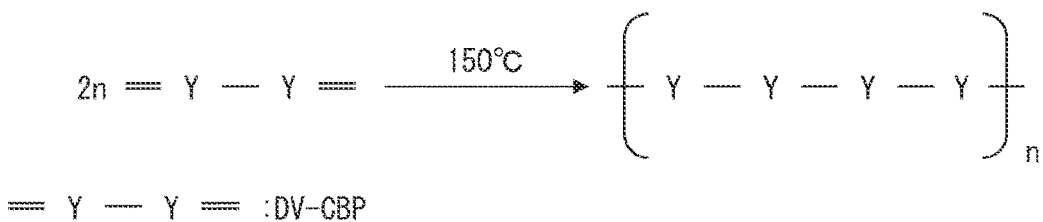
Figure 11:
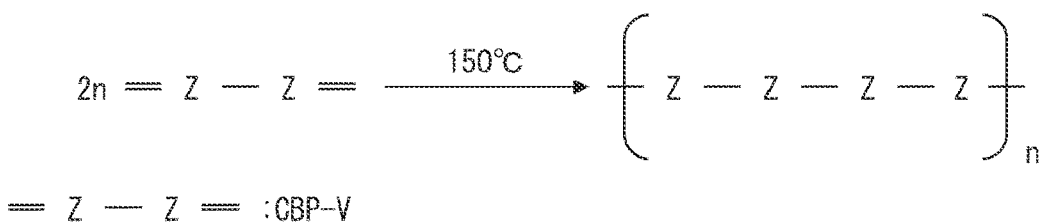
Figure 12:
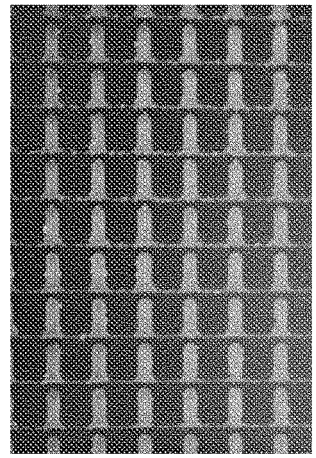
FIG. 12 illustrates the solvent resistance characteristic of a hole transport layer with the weight ratio between a first hole transport material having a 3D mesh structure where VNPBs are joined together through a heat treatment at 150° C. to constitute a high molecule and a second hole transport material containing polyvinyl carbazole (PVK) standing at 1:2.
Figure 13:
FIG. 13(a) illustrates an example molecule including a hole-transportability skeleton, and a phosphonate group ($-PO_3H_2$) and a hydroxy group ($-OH$), both of which are thermosetting functional groups.
FIG. 13(b) illustrates a 3D-mesh-structured high molecular material contained in a hole transport layer included in a display device in a third embodiment and obtained by heating the molecule illustrated in FIG. 13(a).
Figure 13:
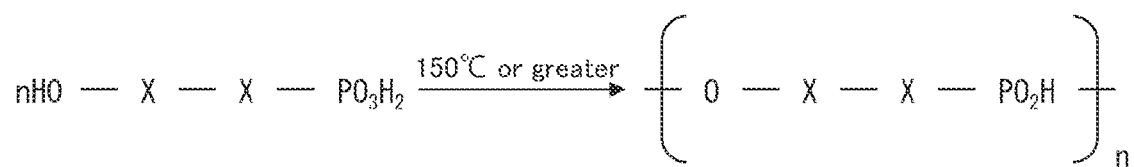
Figure 14:
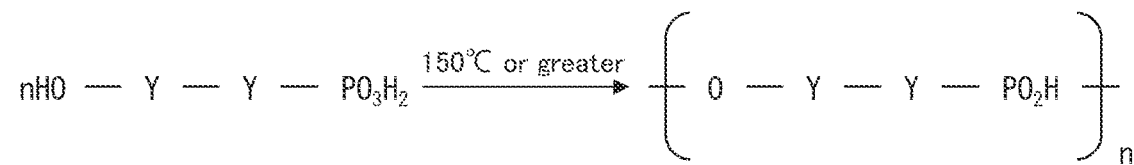
FIG. 14(a) and FIG. 14(b) illustrate a 3D-mesh-structured high molecular material contained in a hole transport layer included in another modified version of the display device in the third embodiment and obtained by heating a molecule including a phosphonate group ($-PO_3H_2$) and a hydroxy group ($-OH$), both of which are thermosetting functional groups, and including a hole-transportability skeleton different from that of the molecule illustrated in FIG. 13(a).
Figure 14:
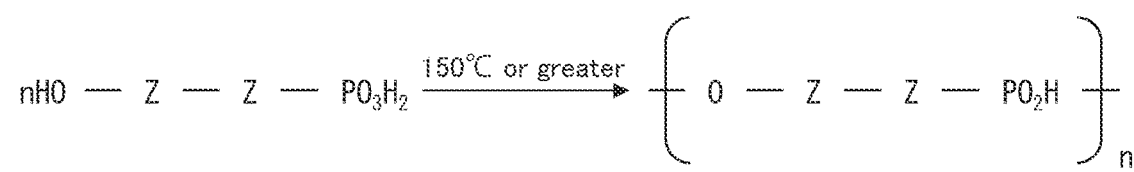
Figure 15:
FIG. 15(a) illustrates an example molecule including a hole-transportability skeleton, and a carboxyl group ($-COOH$) and a hydroxy group ($-OH$), both of which are thermosetting functional groups.
FIG. 15(b) illustrates a 3D-mesh-structured high molecular material contained in a hole transport layer included in further another modified version of the display device in the third embodiment, and obtained by heating the molecule illustrated in FIG. 15(a).
Figure 15:
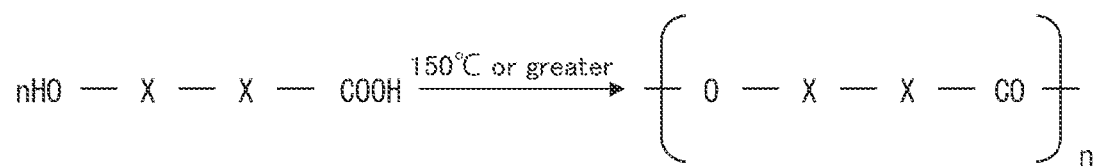
Figure 16:
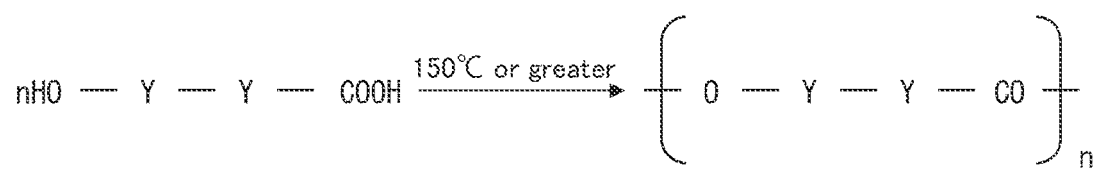
FIG. 16(a) and FIG. 16(b) illustrate a 3D-mesh-structured high molecular material contained in a hole transport layer included in further another modified version of the display device in the third embodiment, and obtained by heating a molecule including a carboxyl group ($-COOH$) and a hydroxy group ($-OH$), both of which are thermosetting functional groups, and including a hole-transportability skeleton different from that of the molecule illustrated in FIG. 15(a).
Figure 16:
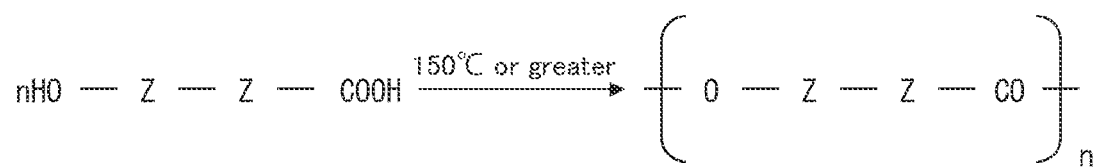

The following describes a second embodiment of the disclosure on the basis of FIG. 11 and FIG. 12. This embodiment is different from the first embodiment in that a heat treatment for joining together precursors (precursor molecules), including VNPB, DV-CBP and CBP-V, of the 3D-mesh-structured first hole transport material, contained in the hole transport layer 24HT, to constitute a high molecule is performed at 150° C. The others have been described in the first embodiment. For convenience in description, components having the same functions as the components illustrated in the drawings relating to the first embodiment will be denoted by the same signs, and their description will be omitted.

FIG. 11(a) illustrates a 3D-mesh-structured high molecular material obtained by heating VNPB contained in a hole transport layer included in a display device in the second embodiment, FIG. 11(b) illustrates a 3D-mesh-structured high molecular material obtained by heating DV-CBP contained in a hole transport layer included in a modified version of the display device in the second embodiment, and FIG. 11(c) illustrates a 3D-mesh-structured high molecular material obtained by heating CBP-V contained in a hole transport layer included in another modified version of the display device in the second embodiment.

The VNPB illustrated in FIG. 11(a), the DV-CBP illustrated in FIG. 11(b) and the CBP-V illustrated in FIG. 11(c) are example precursors (precursor molecules) of the 3D-mesh-structured first hole transport material contained in the hole transport layer 24HT, and these precursors (precursor molecules) all have a vinyl group as a thermosetting functional group; accordingly, a heat treatment at 150° C. under an inert gas (e.g., a nitrogen gas or an argon gas) atmosphere for instance can provide a first hole transport material having a 3D mesh structure with precursors (precursor molecules) joined together to constitute a high molecule.

As described above, a heat treatment at 150° C. can prevent performance degradation of the hole injection layer 24HI resulting from this heat treatment. It is noted that the foregoing heat treatment at 150° C. for joining the precursors (precursor molecules) together to constitute a high molecule is non-limiting; this treatment is preferably performed at 120 to 230° C. inclusive.

FIG. 12 illustrates the solvent resistance characteristic of a hole transport layer with the weight ratio between a first hole transport material having a 3D mesh structure where VNPBs are joined together through a heat treatment at 150° C. to constitute a high molecule and a second hole transport material containing polyvinyl carbazole (PVK) standing at 1:2.

As illustrated in FIG. 12, the hole transport layer 24HT containing the 3D-mesh-structured first hole transport material with VNPBs joined together through a heat treatment at 150° C., which is a relatively low temperature, to constitute a high molecule, and containing the PVK-containing second hole transport material exhibits a favorable solvent resistance characteristic and has hole transportability, but unlike a hole transport layer made of a high molecular material having no 3D mesh structure, the hole transport layer 24HT is not peeled off by a solvent that is used in a posterior process step.

Third Embodiment

The following describes a third embodiment of the disclosure on the basis of FIG. 13, FIG. 14, FIG. 15 and FIG. 16. This embodiment is different from the first and second embodiment in that the precursors (precursor molecules) of the 3D-mesh-structured first hole transport material contained in the hole transport layer 24HT include a thermosetting functional group other than a vinyl group. The others have been described in the first and second embodiments. For convenience in description, components having the same functions as the components illustrated in the drawings relating to the first and second embodiments will be denoted by the same signs, and their description will be omitted.

FIG. 13(a) illustrates an example molecule including a hole-transportability skeleton (X-X), and a phosphonate group ($-PO_3H_2$) and a hydroxy group ($-OH$), both of which are thermosetting functional groups, and FIG. 13(b) illustrates a 3D-mesh-structured high molecular material contained in a hole transport layer included in a display device in the third embodiment and obtained by heating the molecule illustrated in FIG. 13(a).

FIG. 14(a) and FIG. 14(b) illustrate a 3D-mesh-structured high molecular material contained in a hole transport layer included in another modified version of the display device in the third embodiment and obtained by heating a molecule including a phosphonate group ($-PO_3H_2$) and a hydroxy group ($-OH$), both of which are thermosetting functional groups, and including a hole-transportability skeleton (Y-Y or Z-Z) different from that of the molecule illustrated in FIG. 13(a).

FIG. 15(a) illustrates an example molecule including a hole-transportability skeleton (X-X), and a carboxyl group (—COOH) and a hydroxy group (—OH), both of which are thermosetting functional groups, and FIG. 15(b) illustrates a 3D-mesh-structured high molecular material contained in a hole transport layer included in further another modified version of the display device in the third embodiment, and obtained by heating the molecule illustrated in FIG. 15(a).

FIG. 16(a) and FIG. 16(b) illustrate a 3D-mesh-structured high molecular material contained in a hole transport layer included in further another modified version of the display device in the third embodiment, and obtained by heating a molecule including a carboxyl group (—COOH) and a hydroxy group (—OH), both of which are thermosetting functional groups, and including a hole-transportability skeleton (Y-Y or Z-Z) different from that of the molecule illustrated in FIG. 15(a).

The precursors (precursor molecules) of the 3D-mesh-structured first hole transport material contained in the hole transport layer 24HT illustrated in FIG. 13, FIG. 14, FIG. 15 and FIG. 16 include, as thermosetting functional groups, a phosphonate group (—PO$_3$H$_2$) and a hydroxy group (—OH), or a carboxyl group (—COOH) and a hydroxy group (—OH); accordingly, a heat treatment at 150° C. under an inert gas (e.g., a nitrogen gas or an argon gas) for instance can provide a first hole transport material having a 3D mesh structure with precursors (precursor molecules) joined together to constitute a high molecule.

As described above, a heat treatment at 150° C. can prevent performance degradation of the hole injection layer 24HI resulting from this heat treatment. It is noted that the foregoing heat treatment at 150° C. for joining the precursors (precursor molecules) together to constitute a high molecule is non-limiting; this treatment is preferably performed at 120 to 230° C. inclusive.

As described above, the hole transport layer 24HT, containing the first hole transport material having a 3D mesh structure with precursors (precursor molecules) having, as thermosetting functional groups, a phosphonate group (—PO$_3$H$_2$) and a hydroxy group (—OH), or a carboxyl group (—COOH) and a hydroxy group (—OH) being joined together to constitute a high molecule, and containing the second hole transport material including a plurality of molecules having hole transportability, has a high solvent resistance characteristic and a high hole transport characteristic, and thus unlike a hole transport layer made of a high molecular material having hole transportability but having no 3D mesh structure, the hole transport layer 24HT is not peeled off by a solvent that is used in a posterior process step.

It is noted that the hole-transportability skeleton (X-X) illustrated in FIG. 13(a), FIG. 13(b), FIG. 15(a) and FIG. 15(b) is the same as the hole-transportability skeleton (X-X) expressed by the foregoing (Chemical Formula 1), the hole-transportability skeleton (Y-Y) illustrated in FIG. 14(a) and FIG. 16(a) is the same as the hole-transportability skeleton (Y-Y) expressed by the foregoing (Chemical Formula 2), and the hole-transportability skeleton (Z-Z) illustrated in FIG. 14(b) and FIG. 16(b) is the same as the hole-transportability skeleton (Z-Z) expressed by the foregoing (Chemical Formula 3).

Fourth Embodiment

Figure 17:
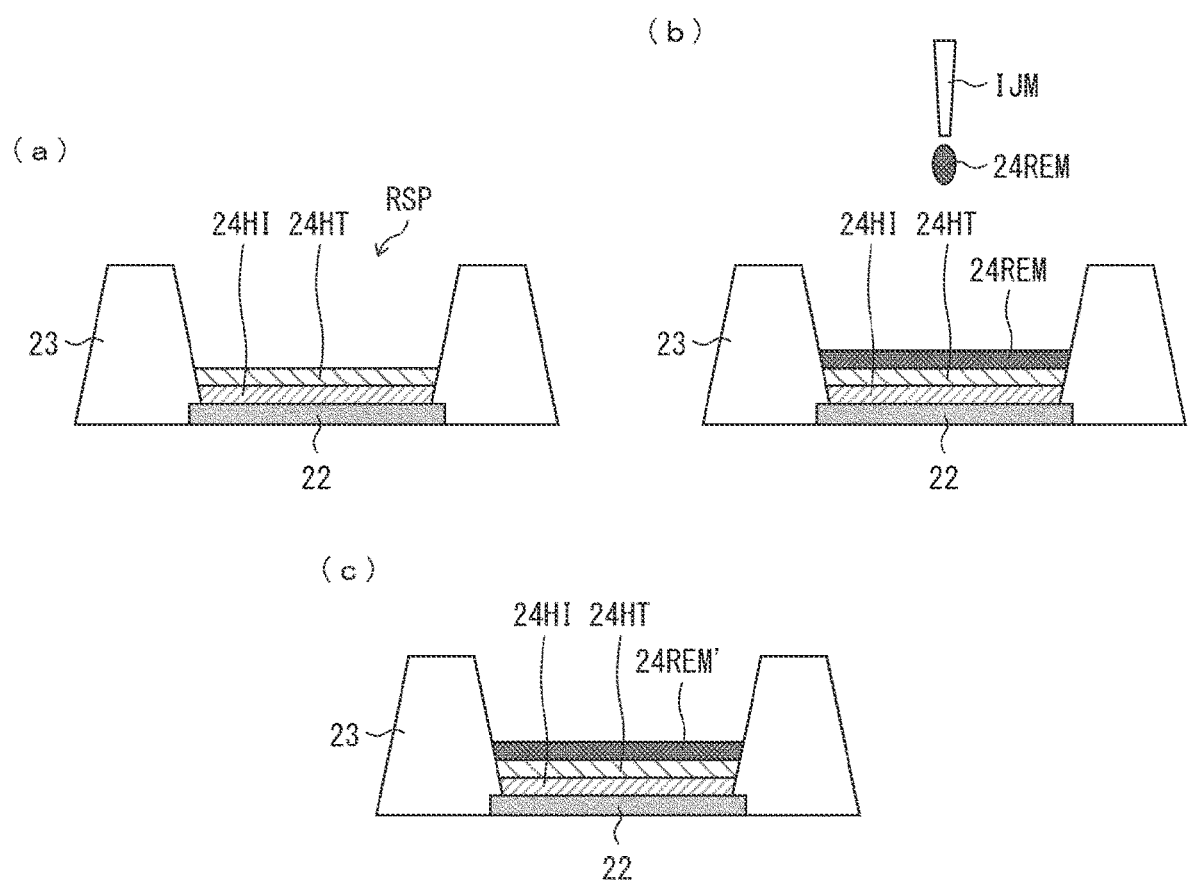
FIG. 17(a), FIG. 17(b) and FIG. 17(c) illustrate an instance where the red light-emitting layer of the red light-emitting element included in a red subpixel provided in a display device in a fourth embodiment is formed through ink-jet printing.

The following describes a fourth embodiment of the disclosure on the basis of FIG. 17. This embodiment is different from the first to third embodiment in that for instance, a red light-emitting layer 24REM' is a light-emitting layer that includes quantum dots and is formed through ink-jet printing. The others have been described in the first to third embodiments. For convenience in description, components having the same functions as the components illustrated in the drawings relating to the first to third embodiments will be denoted by the same signs, and their description will be omitted.

FIG. 17(a), FIG. 17(b) and FIG. 17(c) illustrate an instance where the red light-emitting layer 24REM' of the red light-emitting element 5R included in the red subpixel RSP provided in a display device in the fourth embodiment is formed through ink-jet printing.

It is noted that although not shown, a green light-emitting layer and a blue light-emitting layer are light-emitting layers as well, that include quantum dots and are formed through ink-jet printing.

For forming the red light-emitting layer 24REM', green light-emitting layer and blue light-emitting layer through ink-jet printing with an ink-jet printing apparatus IJM, the first resist layer 30, second resist layer 30 and third resist layer 30, described in the first embodiment, do not have to be used.

The red light-emitting layer 24REM' can be formed into a predetermined shape, as illustrated in FIG. 17(c), by, as illustrated in FIG. 17(a) and FIG. 17(b), dropping a red light-emitting material solution (first light-emitting material solution) containing quantum dots (first light-emitting materials) that emit red light and containing a solvent onto the hole transport layer 24HT of the red light-emitting element 5R, included in the red subpixel RSP, and inside the bank 23, followed by removing the solvent through processing, such as a heat treatment.

Although not shown, the green light-emitting layer can be formed into a predetermined shape by dropping a green light-emitting material solution (second light-emitting material solution) containing quantum dots (second light-emitting material) that emit green light and containing a solvent onto the hole transport layer 24HT of the green light-emitting element 5G, included in the green subpixel GSP, and inside the bank 23, followed by removing the solvent through processing, such as a heat treatment; moreover, the blue light-emitting layer can be formed into a predetermined shape by dropping a blue light-emitting material solution (third light-emitting material solution) containing quantum dots (third light-emitting material) that emit blue light and containing a solvent onto the hole transport layer 24HT of the blue light-emitting element 5B, included in the blue subpixel BSP, and inside the bank 23, followed by removing the solvent through processing, such as a heat treatment.

As described above, even in the process steps for forming the red light-emitting layer 24REM', green light-emitting layer and blue light-emitting layer through ink-jet printing with the ink-jet printing apparatus IJM, the solvents come into contact with the hole transport layers 24HT in the process step of dropping the solvent-containing red light-emitting material solution (first light-emitting material solution), the solvent-containing green light-emitting material solution (second light-emitting material solution) and the solvent-containing blue light-emitting material solution (third light-emitting material solution), thus achieving a great effect that is brought by the hole transport layer 24HT having a high solvent resistance characteristic.

SUMMARY

First Aspect
A light-emitting element including:
a first electrode;
a hole transport layer formed on the first electrode;
a light-emitting layer formed on the hole transport layer; and
a second electrode formed on the light-emitting layer,
wherein the hole transport layer contains a first hole transport material having a 3D mesh structure with molecules including a hole-transportability skeleton and at least two thermosetting functional groups being joined together to constitute a high molecule and contains a second hole transport material including a plurality of molecules having hole transportability.

Second Aspect
The light-emitting element according to the first aspect, wherein the at least two thermosetting functional groups are a vinyl group.

Third Aspect
The light-emitting element according to the second aspect, wherein
the molecules including the hole-transportability skeleton and the at least two thermosetting functional groups are N4,N4'-Di(naphthalen-1-yl)-N4,N4'-bis(4-vinylphenyl)biphenyl-4,4'-diamine (VNPB), and
the second hole transport material is polyvinyl carbazole (PVK), or poly[(9,9-dioctylfluorenyl-2,7-dyl)-co-(4,4'-(N-(4-sec-butylphenyl))diphenylamine)](TFB).

Fourth Aspect
The light-emitting element according to the second aspect, wherein
the molecules including the hole-transportability skeleton and the at least two thermosetting functional groups are 4,4'-Bis(3-((4-vinylphenoxy)methyl)-9H-carbazol-9-yl)biphenyl (DV-CBP), and
the second hole transport material is polyvinyl carbazole (PVK), or poly[(9,9-dioctylfluorenyl-2,7-dyl)-co-(4,4'-(N-(4-sec-butylphenyl))diphenylamine)](TFB).

Fifth Aspect
The light-emitting element according to the second aspect, wherein
the molecules including the hole-transportability skeleton and the at least two thermosetting functional groups are 4,4'-bis(N-carbazolyl)-1,1'-biphenyl-vinyl (CBP-V), and
the second hole transport material is polyvinyl carbazole (PVK), or poly[(9,9-dioctylfluorenyl-2,7-dyl)-co-(4,4'-(N-(4-sec-butylphenyl))diphenylamine)](TFB).

Sixth Aspect
The light-emitting element according to the first aspect, wherein the at least two thermosetting functional groups are a phosphonate group ($-PO_3H_2$) and a hydroxy group ($-OH$).

Seventh Aspect
The light-emitting element according to the first aspect, wherein the at least two thermosetting functional groups are a carboxyl group ($-COOH$) and a hydroxy group ($-OH$).

Eighth Aspect
The light-emitting element according to any one of the first to seventh aspects, wherein the weight of the second hole transport material is larger than the weight of the first hole transport material by 1 to 4 times inclusive.

Ninth Aspect
The light-emitting element according to any one of the first to eighth aspects, wherein the light-emitting layer includes a quantum dot.

Tenth Aspect
The light-emitting element according to any one of the first to eighth aspects, wherein the light-emitting layer is made of an organic material.

Eleventh Aspect
The light-emitting element according to any one of the first to tenth aspect, further including a hole injection layer between the first electrode and the hole transport layer.

Twelfth Aspect
A display device including a plurality of the light-emitting elements according to any one of the first to eleventh aspects provided on a substrate,
wherein the plurality of light-emitting elements include a first light-emitting element, a second light-emitting element, and a third light-emitting element,
the first light-emitting element includes a first light-emitting layer as the light-emitting layer,
the second light-emitting element includes, as the light-emitting layer, a second light-emitting layer different in emission peak wavelength from the first light-emitting layer, and
the third light-emitting element includes, as the light-emitting layer, a third light-emitting layer different in emission peak wavelength from the first light-emitting layer and the second light-emitting layer.

Thirteenth Aspect
A method for manufacturing a display device, including the steps of:
forming a first electrode;
forming a hole transport layer including a step of forming a hole-transport-material-mixed solution containing a plurality of molecules each including a hole-transportability skeleton and at least two thermosetting functional groups, and containing a plurality of hole-transportability molecules and a solvent onto the first electrode, followed by a heat treatment to join together the plurality of molecules including the hole-transportability skeleton and the at least two thermosetting functional groups, to constitute a 3D-mesh-structured high molecular material;
forming a light-emitting layer onto the hole transport layer; and
forming a second electrode onto the light-emitting layer.

Fourteenth Aspect
The method for manufacturing the display device according to the thirteenth aspect, wherein the heat treatment is performed at 120 to 230° C. inclusive.

Fifteenth Aspect
The method for manufacturing the display device according to the thirteenth or fourteenth aspect, wherein
a plurality of light-emitting elements including the first electrode, the hole transport layer, the light-emitting layer, and the second electrode are provided on a substrate,
the plurality of light-emitting elements include a first light-emitting element, a second light-emitting element, and a third light-emitting element,
the first light-emitting element includes a first light-emitting layer as the light-emitting layer,
the second light-emitting element includes, as the light-emitting layer, a second light-emitting layer different in emission peak wavelength from the first light-emitting layer, the third light-emitting element includes, as the light-emitting layer, a third light-emitting layer different in emission peak wavelength from the first light-emitting layer and the second light-emitting layer, and the step of forming the light-emitting layer includes
- a step of forming a first resist layer onto at least the hole transport layer of the first light-emitting element, the hole transport layer of the second light-emitting element, and the hole transport layer of the third light-emitting element, followed by subjecting a first region of the first resist layer overlapping the hole transport layer of the first light-emitting element in a plan view to exposure and development to form a first opening in the first region of the first resist layer,
- a step of forming the first light-emitting layer onto the hole transport layer in the first opening, and the first resist layer, followed by removal of the first resist layer to form the first light-emitting layer of the first light-emitting element,
- a step of forming a second resist layer onto at least the first light-emitting layer of the first light-emitting element, the hole transport layer of the second light-emitting element, and the hole transport layer of the third light-emitting element, followed by subjecting a second region of the second resist layer overlapping the hole transport layer of the second light-emitting element in a plan view to exposure and development to form a second opening in the second region of the second resist layer,
- a step of forming the second light-emitting layer onto the hole transport layer in the second opening, and the second resist layer, followed by removal of the second resist layer to form the second light-emitting layer of the second light-emitting element,
- a step of forming a third resist layer onto at least the first light-emitting layer of the first light-emitting element, the second light-emitting layer of the second light-emitting element, and the hole transport layer of the third light-emitting element, followed by subjecting a third region of the third resist layer overlapping the hole transport layer of the third light-emitting element in a plan view to exposure and development to form a third opening in the third region of the third resist layer, and
- a step of forming the third light-emitting layer onto the hole transport layer in the third opening, and the third resist layer, followed by removal of the third resist layer to form the third light-emitting layer of the third light-emitting element.

Sixteenth Aspect

The method for manufacturing the display device according to the fifteenth aspect, wherein the development is performed using a tetramethyl ammonium hydroxide (TMAH) aqueous solution.

Seventeenth Aspect

The method for manufacturing the display device according to the fifteenth or sixteenth aspect, wherein the removal is performed using a polar solvent.

Eighteenth Aspect

The method for manufacturing the display device according to the seventeenth aspect, wherein the polar solvent is propylene glycol monomethyl ether acetate (PGMEA).

Nineteenth Aspect

The method for manufacturing the display device according to any one of the fifteenth to eighteenth aspects, wherein the first light-emitting layer, the second light-emitting layer and the third light-emitting layer are light-emitting layers including a quantum dot, and the first light-emitting layer, the second light-emitting layer and the third light-emitting layer are formed through application.

Twentieth Aspect

The method for manufacturing the display device according to any one of the fifteenth to eighteenth aspects, wherein the first light-emitting layer, the second light-emitting layer and the third light-emitting layer are formed through evaporation.

Twenty-First Aspect

The method for manufacturing the display device according to the thirteenth or fourteenth aspect, wherein
- a plurality of light-emitting elements including the first electrode, the hole transport layer, the light-emitting layer, and the second electrode are provided on a substrate,
- the plurality of light-emitting elements include a first light-emitting element, a second light-emitting element, and a third light-emitting element,
- the first light-emitting element includes a first light-emitting layer as the light-emitting layer,
- the second light-emitting element includes, as the light-emitting layer, a second light-emitting layer different in emission peak wavelength from the first light-emitting layer,
- the third light-emitting element includes, as the light-emitting layer, a third light-emitting layer different in emission peak wavelength from the first light-emitting layer and the second light-emitting layer, and the step of forming the light-emitting layer includes
- a step of forming a first light-emitting material solution containing a first light-emitting material, a photosensitive resist, and a solvent onto at least the hole transport layer of the first light-emitting element, the hole transport layer of the second light-emitting element, and the hole transport layer of the third light-emitting element, and forming the first light-emitting layer,
- a step of patterning the first light-emitting layer for forming the first light-emitting layer of the first light-emitting element by subjecting the first light-emitting layer to exposure and development,
- a step of forming a second light-emitting material solution containing a second light-emitting material, a photosensitive resist, and a solvent onto at least the first light-emitting layer of the first light-emitting element, the hole transport layer of the second light-emitting element, and the hole transport layer of the third light-emitting element, and forming the second light-emitting layer,
- a step of patterning the second light-emitting layer for forming the second light-emitting layer of the second light-emitting element by subjecting the second light-emitting layer to exposure and development,
- a step of forming a third light-emitting material solution containing a third light-emitting material, a photosensitive resist, and a solvent onto at least the first light-emitting layer of the first light-emitting element, the second light-emitting layer of the second light-emitting element, and the hole transport layer of the third light-emitting element, and forming the third light-emitting layer, and
- a step of patterning the third light-emitting layer for forming the third light-emitting layer of the third light-emitting element by subjecting the third light-emitting layer to exposure and development.

Twenty-Second Aspect

The method for manufacturing the display device according to the thirteenth or fourteenth aspect, wherein
- a plurality of light-emitting elements including the first electrode, the hole transport layer, the light-emitting layer, and the second electrode are provided on a substrate,
- the plurality of light-emitting elements include a first light-emitting element, a second light-emitting element, and a third light-emitting element,
- the first light-emitting element includes a first light-emitting layer as the light-emitting layer,
- the second light-emitting element includes, as the light-emitting layer, a second light-emitting layer different in emission peak wavelength from the first light-emitting layer,
- the third light-emitting element includes, as the light-emitting layer, a third light-emitting layer different in emission peak wavelength from the first light-emitting layer and the second light-emitting layer, and
- the step of forming the light-emitting layer includes
  - a step of dropping a first light-emitting material solution containing a first light-emitting material and a solvent onto the hole transport layer of the first light-emitting element, and forming the first light-emitting layer, and
  - a step of dropping a second light-emitting material solution containing a second light-emitting material and a solvent onto the hole transport layer of the second light-emitting element, and forming the second light-emitting layer, and
  - a step of dropping a third light-emitting material solution containing a third light-emitting material and a solvent onto the hole transport layer of the third light-emitting element, and forming the third light-emitting layer.

Additional Note

The disclosure is not limited to the foregoing embodiments. Various modifications can be devised within the scope of the claims. An embodiment that is obtained in combination, as appropriate, with the technical means disclosed in the respective embodiments is also included in the technical scope of the present disclosure. Furthermore, combining the technical means disclosed in the respective embodiments can form a new technical feature.

INDUSTRIAL APPLICABILITY

The disclosure is applicable to a method for driving a display device, and to a display device.

The invention claimed is:

1. A light-emitting element comprising:
   a first electrode;
   a hole transport layer formed on the first electrode;
   a light-emitting layer formed on the hole transport layer; and
   a second electrode formed on the light-emitting layer,
   wherein the hole transport layer contains a first hole transport material having a 3D mesh structure with molecules including a hole-transportability skeleton and at least two thermosetting functional groups being joined together to constitute a high molecule and contains a second hole transport material including a plurality of molecules having hole transportability·,
   the at least two thermosetting functional groups are a vinyl group,
   the molecules including the hole-transportability skeleton and the at least two thermosetting functional groups are 4,4'-Bis(3-((4-vinylphenoxy)methyl)-9H-carbazol-9-yl)biphenyl (DV-CBP), and
   the second hole transport material is polyvinyl carbazole (PVK), or poly[(9,9-dioctylfluorenyl-2,7-dyl)-co-(4,4'-(N-(4-sec-butylphenyl))diphenylamine)] (TFB).

2. The light-emitting element according to claim 1, wherein a weight of the second hole transport material is larger than a weight of the first hole transport material by 1 to 4 times inclusive.

3. The light-emitting element according to claim 1, wherein the light-emitting layer includes a quantum dot.

4. The light-emitting element according to claim 1, wherein the light-emitting layer is made of an organic material.

5. The light-emitting element according to claim 1, further comprising a hole injection layer between the first electrode and the hole transport layer.

6. A display device comprising a plurality of the light-emitting elements according to claim 1 provided on a substrate,
   wherein the plurality of light-emitting elements include a first light-emitting element, a second light-emitting element, and a third light-emitting element,
   the first light-emitting element includes a first light-emitting layer as the light-emitting layer,
   the second light-emitting element includes, as the light-emitting layer, a second light-emitting layer different in emission peak wavelength from the first light-emitting layer, and
   the third light-emitting element includes, as the light-emitting layer, a third light-emitting layer different in emission peak wavelength from the first light-emitting layer and the second light-emitting layer.

7. A method for manufacturing a display device, comprising the steps of:
   forming a first electrode;
   forming a hole transport layer including a step of forming a hole-transport-material-mixed solution containing a plurality of molecules each including a hole-transportability skeleton and at least two thermosetting functional groups, and containing a plurality of hole-transportability molecules and a solvent onto the first electrode, followed by a heat treatment to join together the plurality of molecules including the hole-transportability skeleton and the at least two thermosetting functional groups, to constitute a 3D-mesh-structured high molecular material;
   forming a light-emitting layer onto the hole transport layer;
   forming a second electrode onto the light-emitting layer·, wherein
   a plurality of light-emitting elements including the first electrode, the hole transport layer, the light-emitting layer, and the second electrode are provided on a substrate,
   the plurality of light-emitting elements include a first light-emitting element, a second light-emitting element, and a third light-emitting element,
   the first light-emitting element includes a first light-emitting layer as the light-emitting layer, the second light-emitting element includes, as the light-emitting layer, a second light-emitting layer different in emission peak wavelength from the first light-emitting layer, the third light-emitting element includes, as the light-emitting layer, a third light-emitting layer different in emission peak wavelength from the first light-emitting layer and the second light-emitting layer, and the step of forming the light-emitting layer includes a step of forming a first resist layer onto at least the hole transport layer of the first light-emitting element, the hole transport layer of the second light-emitting element, and the hole transport layer of the third light-emitting element, followed by subjecting a first region of the first resist layer overlapping the hole transport layer of the first light-emitting element in a plan view to exposure and development to form a first opening in the first region of the first resist layer, a step of forming the first light-emitting layer onto the hole transport layer in the first opening, and the first resist layer, followed by removal of the first resist layer to form the first light-emitting layer of the first light-emitting element, a step of forming a second resist layer onto at least the first light-emitting layer of the first light-emitting element, the hole transport layer of the second light-emitting element, and the hole transport layer of the third light-emitting element, followed by subjecting a second region of the second resist layer overlapping the hole transport layer of the second light-emitting element in a plan view to exposure and development to form a second opening in the second region of the second resist layer, a step of forming the second light-emitting layer onto the hole transport layer in the second opening, and the second resist layer, followed by removal of the second resist layer to form the second light-emitting layer of the second light-emitting element, a step of forming a third resist layer onto at least the first light-emitting layer of the first light-emitting element, the second light-emitting layer of the second light-emitting element, and the hole transport layer of the third light-emitting element, followed by subjecting a third region of the third resist layer overlapping the hole transport layer of the third light-emitting element in a plan view to exposure and development to form a third opening in the third region of the third resist layer, and a step of forming the third light-emitting layer onto the hole transport layer in the third opening, and the third resist layer, followed by removal of the third resist layer to form the third light-emitting layer of the third light-emitting element.

8. The method for manufacturing the display device according to claim 7, wherein the development is performed using a tetramethyl ammonium hydroxide (TMAH) aqueous solution.

9. The method for manufacturing the display device according to claim 7, wherein the removal is performed using a polar solvent.

10. The method for manufacturing the display device according to claim 9, wherein the polar solvent is propylene glycol monomethyl ether acetate (PGMEA).

11. The method for manufacturing the display device according to claim 7, wherein the first light-emitting layer, the second light-emitting layer and the third light-emitting layer are light-emitting layers including a quantum dot, and the first light-emitting layer, the second light-emitting layer and the third light-emitting layer are formed through application.

12. The method for manufacturing the display device according to claim 7, wherein the first light-emitting layer, the second light-emitting layer and the third light-emitting layer are formed through evaporation.

13. A light-emitting element comprising:
a first electrode;
a hole transport layer formed on the first electrode;
a light-emitting layer formed on the hole transport layer; and
a second electrode formed on the light-emitting layer,
wherein the hole transport layer contains a first hole transport material having a 3D mesh structure with molecules including a hole-transportability skeleton and at least two thermosetting functional groups being joined together to constitute a high molecule and contains a second hole transport material including a plurality of molecules having hole transportability,
the at least two thermosetting functional groups are a phosphonate group ($-PO_3H_2$) and a hydroxy group ($-OH$), or a carboxyl group ($-COOH$) and a hydroxy group ($-OH$).

14. The light-emitting element according to claim 13, wherein a weight of the second hole transport material is larger than a weight of the first hole transport material by 1 to 4 times inclusive.

15. The light-emitting element according to claim 13, wherein the light-emitting layer includes a quantum dot.

16. The light-emitting element according to claim 13, wherein the light-emitting layer is made of an organic material.

17. The light-emitting element according to claim 13, further comprising a hole injection layer between the first electrode and the hole transport layer.

18. A display device comprising a plurality of the light-emitting elements according to claim 13 provided on a substrate, wherein the plurality of light-emitting elements include a first light-emitting element, a second light-emitting element, and a third light-emitting element, the first light-emitting element includes a first light-emitting layer as the light-emitting layer, the second light-emitting element includes, as the light-emitting layer, a second light-emitting layer different in emission peak wavelength from the first light-emitting layer, and the third light-emitting element includes, as the light-emitting layer, a third light-emitting layer different in emission peak wavelength from the first light-emitting layer and the second light-emitting layer.

* * * * *